(12) United States Patent
Baek et al.

(10) Patent No.: US 11,744,028 B2
(45) Date of Patent: *Aug. 29, 2023

(54) ELECTRONIC DEVICE INCLUDING THIN HOUSING, AND MANUFACTURING METHOD THEREFOR

(71) Applicant: Samsung Electronics Co., Ltd., Suwon-si (KR)

(72) Inventors: Seung Chang Baek, Yongin-si (KR); Hyeong Sam Son, Hwaseong-si (KR); Chang Jin Song, Seoul (KR); Chang Hyeok Shin, Seoul (KR); Sung Ho Cho, Anyang-si (KR); Chong Kun Cho, Suwon-si (KR); Han Gyu Hwang, Seoul (KR); Min Woo Yoo, Osan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 166 days.

This patent is subject to a terminal disclaimer.

(21) Appl. No.: 17/358,815

(22) Filed: Jun. 25, 2021

(65) Prior Publication Data

US 2021/0329800 A1 Oct. 21, 2021

Related U.S. Application Data

(63) Continuation of application No. 16/779,950, filed on Feb. 3, 2020, now Pat. No. 11,051,416, which is a (Continued)

(30) Foreign Application Priority Data

Mar. 13, 2017 (KR) ........................ 10-2017-0031395

(51) Int. Cl.
*H05K 5/02* (2006.01)
*H05K 5/00* (2006.01)
(Continued)

(52) U.S. Cl.
CPC ........ *H05K 5/0217* (2013.01); *C25D 11/005* (2013.01); *C25D 11/022* (2013.01);
(Continued)

(58) Field of Classification Search
CPC .. H05K 5/0217; H05K 5/0017; H05K 5/0086; H05K 5/04; C25D 11/005;
(Continued)

(56) References Cited

U.S. PATENT DOCUMENTS 7,798,340 B2 9/2010 Lin et al.
8,144,451 B2 3/2012 Rodgers et al.
(Continued)

FOREIGN PATENT DOCUMENTS

CN 102719875 A 10/2012
CN 103777696 A 5/2014
(Continued)

OTHER PUBLICATIONS

Korean Notice of Allowance dated Jan. 20, 2022, issued in Korean Patent Application No. 10-2021-0080086.
(Continued)

*Primary Examiner* — Abhishek M Rathod
(74) *Attorney, Agent, or Firm* — Jefferson IP Law, LLP

(57) ABSTRACT

An electronic device is provided. The electronic device includes a housing comprising a first surface opened while facing a first direction, a second surface facing a second direction that is opposite to the first direction, and one or more side parts disposed in different directions between the first surface and the second surface, a nonconductive structure disposed along at least a portion of the at least one side wall within the housing, and one or more stop recesses including at least one recess formed on one surface of the
(Continued)

one or more side parts and a portion of the nonconductive structure surrounding a peripheral portion of the at least one recess.

16 Claims, 16 Drawing Sheets

Related U.S. Application Data continuation of application No. 16/300,397, filed as application No. PCT/KR2018/002622 on Mar. 6, 2018, now Pat. No. 10,588,226.

(51) Int. Cl.

| | | |
|---|---|---|
| *G06F 1/16* | (2006.01) | |
| *H01Q 1/22* | (2006.01) | |
| *H05K 5/04* | (2006.01) | |
| *C25D 11/02* | (2006.01) | |
| *H04M 1/02* | (2006.01) | |
| *C25D 11/00* | (2006.01) | |
| *C25D 17/06* | (2006.01) | |
| *C25D 11/04* | (2006.01) | |
| *H01Q 1/24* | (2006.01) | |
| *H04B 1/3827* | (2015.01) | |
| *C25D 11/16* | (2006.01) | |
| *H01Q 13/10* | (2006.01) | |

(52) U.S. Cl.
CPC .............. *C25D 11/04* (2013.01); *C25D 17/06* (2013.01); *H01Q 1/22* (2013.01); *H01Q 1/243* (2013.01); *H04M 1/0202* (2013.01); *H05K 5/0017* (2013.01); *H05K 5/0086* (2013.01); *H05K 5/04* (2013.01); *C25D 11/16* (2013.01); *G06F 1/1658* (2013.01); *H01Q 13/10* (2013.01); *H04B 1/3827* (2013.01)

(58) Field of Classification Search
CPC ...... C25D 11/022; C25D 11/04; C25D 17/06; C25D 11/16; C25D 17/005; H01Q 1/22; H01Q 1/243; H01Q 13/10; H04M 1/0202; H04M 1/026; H04M 1/0249; H04M 1/0266; G06F 1/1658; G06F 1/1626; G06F 1/1698; H04B 1/3827
See application file for complete search history.

(56) References Cited

U.S. PATENT DOCUMENTS

| | | |
|---|---|---|
| 8,462,490 B2 | 6/2013 | Shin et al. |
| 9,420,713 B2 | 8/2016 | Browning et al. |
| 9,507,382 B2 | 11/2016 | Lee et al. |
| 9,591,110 B2 | 3/2017 | Hill et al. |
| 9,625,949 B2 | 4/2017 | Lee et al. |
| 9,666,934 B2 | 5/2017 | Lombardi et al. |
| 9,854,694 B2 | 12/2017 | Kiple et al. |
| 9,955,603 B2 | 4/2018 | Kiple et al. |
| 9,985,345 B2 | 5/2018 | Ferretti et al. |
| 9,988,725 B2 | 6/2018 | Choi et al. |
| 10,194,547 B2 | 1/2019 | Jiang et al. |
| 10,201,102 B2 | 2/2019 | Lee et al. |
| 10,218,827 B2 | 2/2019 | Hill et al. |
| 10,231,352 B2 | 3/2019 | Woodhull et al. |
| 10,285,295 B2 | 5/2019 | Kiple et al. |
| 10,433,441 B2 | 10/2019 | Li et al. |
| 10,462,917 B2 | 10/2019 | Lee et al. |
| 10,547,717 B2 | 1/2020 | Hill et al. |
| 10,568,221 B2 | 2/2020 | Li et al. |
| 10,665,924 B2 | 5/2020 | Son et al. |
| 2008/0142461 A1 | 6/2008 | Lin et al. |
| 2009/0015517 A1 | 1/2009 | Park |
| 2011/0096472 A1 | 4/2011 | Rodgers et al. |
| 2011/0279002 A1 | 11/2011 | Han et al. |
| 2011/0317343 A1 | 12/2011 | Shin et al. |
| 2013/0318766 A1 | 12/2013 | Kiple et al. |
| 2013/0319865 A1 | 12/2013 | Browning et al. |
| 2014/0206420 A1 | 7/2014 | Neichi |
| 2015/0055292 A1 | 2/2015 | Lee et al. |
| 2015/0061476 A1 | 3/2015 | Ishikura |
| 2016/0044801 A1 | 2/2016 | Lee et al. |
| 2016/0072932 A1 | 3/2016 | Hill et al. |
| 2016/0233573 A1 | 8/2016 | Son et al. |
| 2016/0301139 A1 | 10/2016 | Lombardi et al. |
| 2016/0302319 A1 | 10/2016 | Ferretti et al. |
| 2017/0013735 A1 | 1/2017 | Choi et al. |
| 2017/0188475 A1 | 6/2017 | Lee et al. |
| 2017/0288720 A1 | 10/2017 | Jiang et al. |
| 2018/0042130 A1 | 2/2018 | Li et al. |
| 2018/0288201 A1 | 10/2018 | Lee et al. |
| 2020/0153950 A1 | 5/2020 | Hill et al. |

FOREIGN PATENT DOCUMENTS

| | | |
|---|---|---|
| CN | 104043947 A | 9/2014 |
| CN | 104539753 A | 4/2015 |
| CN | 105049554 A | 11/2015 |
| CN | 105563038 A | 5/2016 |
| CN | 105873388 A | 8/2016 |
| CN | 205839168 U | 12/2016 |
| CN | 205883323 U | 1/2017 |
| CN | 106664113 A | 5/2017 |
| KR | 10-0644804 B1 | 11/2006 |
| KR | 10-2009-0005805 A | 1/2009 |
| KR | 20-2009-0005805 U | 6/2009 |
| KR | 10-2012-0001458 A | 1/2012 |
| KR | 10-2013-0066854 A | 6/2013 |
| KR | 10-2014-0051666 A | 5/2014 |
| KR | 10-1443563 B1 | 9/2014 |
| KR | 10-2015-0023995 A | 3/2015 |
| KR | 10-2016-0019248 A | 2/2016 |
| KR | 10-1645669 B1 | 8/2016 |
| KR | 10-2016-0120668 A | 10/2016 |
| KR | 10-2016-0149791 A | 12/2016 |
| KR | 10-2016-0149792 A | 12/2016 |
| KR | 10-2017-0006709 A | 1/2017 |
| KR | 10-2017-0006907 A | 1/2017 |
| KR | 10-2017-0023481 A | 3/2017 |
| WO | 2016/101693 A1 | 6/2016 |
| WO | 2018/028372 A1 | 2/2018 |

OTHER PUBLICATIONS

Indian Office Action dated Apr. 20, 2022, issued in Indian Patent Application No. 202148033183.
Korean Office Action dated Jul. 5, 2021, issued in Korean Patent Application No. 10-2021-0080086.
European Search Report dated Oct. 31, 2019; European U.S. Appl. No. 18767290.2-1103 / 3509279 PCT/KR2018002622.
Chinese Office Action dated May 8, 2020, issued in Chinese Patent Application No. 201880003524.2.
Chinese Notice of Allowance dated Oct. 10, 2020, issued in Chinese patent No. 201880003524.2.
Notice of Allowance issued by Korean Intellectual Property Office in Korean Application No. 10-2017-0031395, dated Apr. 24, 2021.
Indian Office Action dated May 3, 2021, issued in the Indian Application No. 201947003856.
Chinese Office Action dated Sep. 30, 2022, issued in Chinese Patent Application No. 202011548129.8.
Vietnamese Office Action dated Sep. 27, 2022, issued in Vietnamese Patent Application No. 1-2019-01717.
Korean Notice of Allowance dated Nov. 24, 2022, issued in Korean Patent Application No. 10-2022-0038068.

ELECTRONIC DEVICE INCLUDING THIN HOUSING, AND MANUFACTURING METHOD THEREFOR

CROSS-REFERENCE TO RELATED APPLICATION(S)

This application is a continuation application of prior application Ser. No. 16/779,950, filed on Feb. 3, 2020, which is a continuation application of prior application Ser. No. 16/300,397, filed on Nov. 9, 2018, which has issued as U.S. Pat. No. 10,588,226 on Mar. 10, 2020, which is a U.S. National Stage application under 35 U.S.C. § 371 of International application number PCT/KR2018/002622, filed on Mar. 6, 2018, which is based on and claimed priority of a Korean patent application number 10-2017-0031395, filed on Mar. 13, 2017, in the Korean Intellectual Property Office, the disclosure of which is incorporated by reference herein in its entirety.

BACKGROUND

1. Field

The disclosure relates to an electronic device including a thin housing.

2. Description of Related Art

In recent years, portable electronic devices in various forms, such as smartphones and tablet personal computers (PCs), have been increasingly distributed. The portable electronic devices may be manufactured by using housings of various materials. In relation to manufacturing of housings of relatively thin thicknesses, at least portions of the housings of the portable electronic devices have recently been formed of metallic materials. Various machining processes may be applied to the housings of metallic materials in the manufacturing processes.

The above information is presented as background information only to assist with an understanding of the disclosure. No determination has been made, and no assertion is made, as to whether any of the above might be applicable as prior art with regard to the disclosure.

SUMMARY

When the housings of electronic devices of the related art are manufactured, the initial thicknesses of the housings have a specific size or more in consideration of various processes. In this way, the housings are machined much in the housing manufacturing processes. Accordingly, in the processes of manufacturing the housings of the electronic devices, machining time is long and manufacturing costs or costs for raw materials are high.

Aspects of the disclosure are to address at least the above-mentioned problems and/or disadvantages and to provide at least the advantages described below. Accordingly, an aspect of the disclosure is to provide an electronic device having a metallic thin housing that may be easily electrically post-processed.

Additional aspects will be set forth in part in the description which follows and, in part, will be apparent from the description, or may be learned by practice of the presented embodiments.

In accordance with an aspect of the disclosure, an electronic device is provided. The electronic device includes a housing including a first surface facing a first direction, a second surface facing a second direction that is opposite to the first direction, and one or more side parts disposed in a space between the first surface and the second surface, at least some of the side parts and at least a portion of the second surface of the housing being formed of a metallic material, a touchscreen display, at least a portion of which is exposed through a portion of the first surface, an internal nonconductive structure attached along at least some of the side parts inside the housing, a wireless communication circuit disposed inside the housing, and a processor electrically connected to the wireless communication circuit and the display and disposed inside the housing. The side part includes a first inner surface facing a third direction that is substantially perpendicular to the first direction. The internal nonconductive structure includes a first opening formed at a portion of the first inner surface of the side part in the third direction. The side part includes an anodizing layer formed at a portion of the first inner surface, and the anodizing layer includes a recess, through which a portion of the first inner surface is exposed.

In accordance with another aspect of the disclosure, an electronic device is provided. The electronic device includes a housing including a first surface opened while facing a first direction, a second surface facing a second direction that is opposite to the first direction, and one or more side parts disposed in different directions between the first surface and the second surface, a nonconductive structure disposed along at least a portion of the at least one side wall within the housing, and one or more stop recesses including at least one recess formed on one surface of the one or more side parts and a portion of the nonconductive structure surrounding a peripheral portion of the at least one recess.

As mentioned above, according to various embodiments, based on the metallic thin housing, time and material costs consumed when a housing is manufactured may be reduced and the housing may be stably electrically post-processed.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
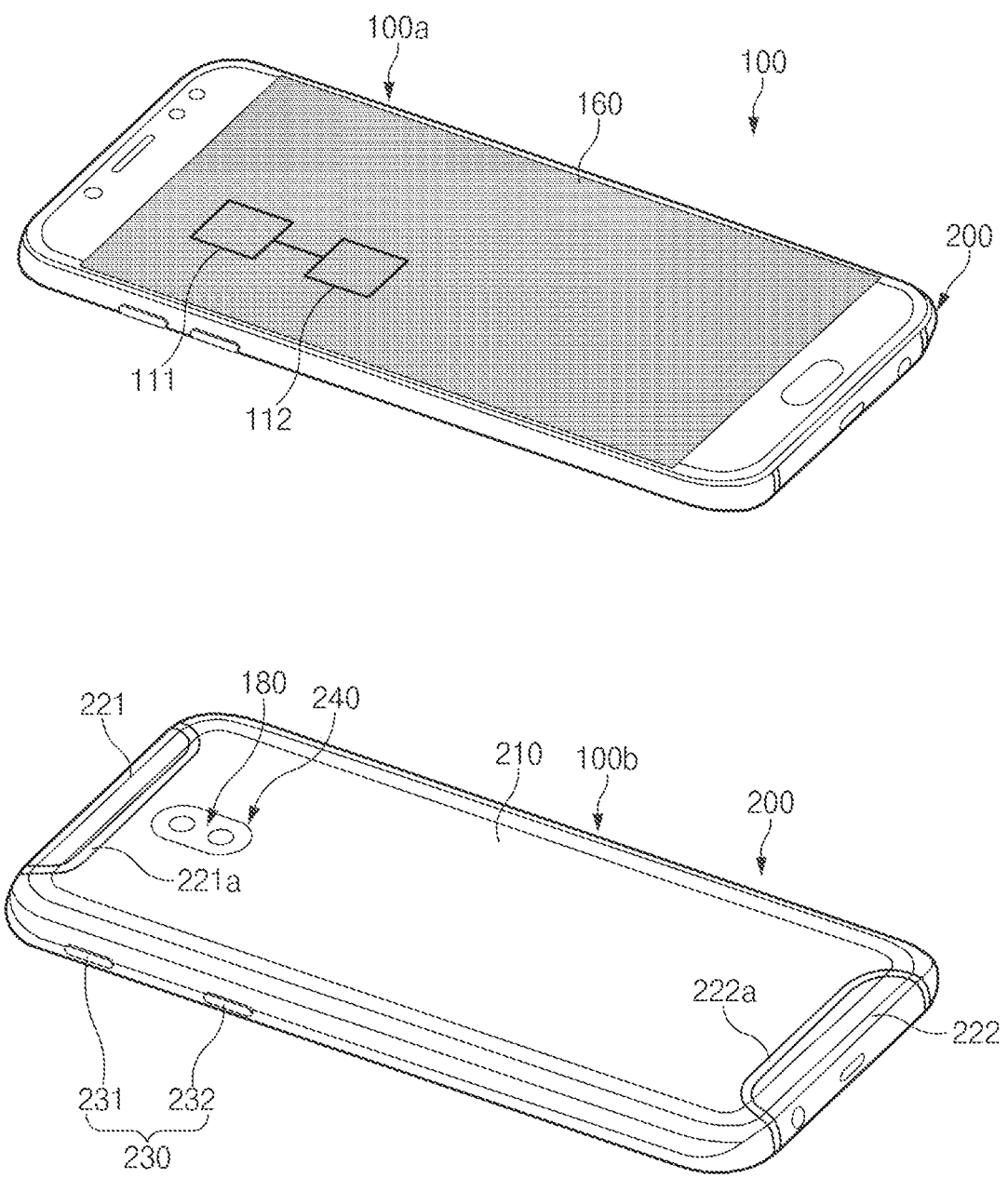
FIG. 1 is a view schematically illustrating an external appearance of an electronic device according to an embodiment of the disclosure.

The following description with reference to accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

In the disclosure, the expressions "have," "may have," "include." and "comprise" or "may include" and "may comprise" used herein indicate existence of corresponding features (e.g., components such as numeric values, functions, operations, or parts) but do not exclude presence of additional features.

In the disclosure, the expressions "A or B," "at least one of A or/and B," or "one or more of A or/and B" and the like may include any and all combinations of one or more of the associated listed items. For example, the term "A or B," "at least one of A and B," or "at least one of A or B" may refer to all of the case (1) where at least one A is included, the case (2) where at least one B is included, or the case (3) where both of at least one A and at least one B are included.

The terms, such as "first," "second," and the like used in the various embodiments may be used to refer to various components regardless of the order and/or the priority and may not limit the corresponding components. The terms may be used to distinguish the relevant components from other components. For example, "a first user device" and "a second user device" indicate different user devices regardless of the order or priority. For example, without departing the scope of the disclosure, a first component may be referred to as a second component, and similarly, a second component may be referred to as a first component.

It will be understood that when a component (e.g., a first component) is referred to as being "(operatively or communicatively) coupled with/to" or "connected to" another component (e.g., a second component), it may be directly coupled with/to or connected to the other component or an intervening component (e.g., a third component) may be present. In contrast, when a component (e.g., a first component) is referred to as being "directly coupled with/to" or "directly connected to" another component (e.g., a second component), it should be understood that there are no intervening component (e.g., a third component).

According to the situation, the expression "configured to" used in the disclosure may be used as, for example, the expression "suitable for," "having the capacity to," "designed to," "adapted to," "made to," or "capable of" The term "configured to" must not mean only "specifically designed to" in hardware. Instead, the expression "a device configured to" may mean that the device is "capable of" operating together with another device or other parts. For example, a "processor configured to (or set to) perform A, B, and C" may mean a dedicated processor (e.g., an embedded processor) for performing a corresponding operation or a generic-purpose processor (e.g., a central processing unit (CPU) or an application processor) which performs corresponding operations by executing one or more software programs which are stored in a memory device.

All the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal unless expressly so defined in various embodiments of the disclosure. In some cases, even if terms are terms which are defined in the disclosure, they may not be interpreted to exclude embodiments of the disclosure.

An electronic device according to various embodiments of the disclosure may include at least one of, for example, smartphones, tablet personal computers (PCs), mobile phones, video telephones, electronic book readers, desktop PCs, laptop PCs, netbook computers, workstations, servers, personal digital assistants (PDAs), portable multimedia players (PMPs), moving picture experts group phase 1 or phase 2 (MPEG-1 or MPEG-2) audio layer 3 (MP3) players, mobile medical devices, cameras, or wearable devices (e.g., a smart glasses, or head-mounted-devices (HMDs)), an electronic apparel, an electronic bracelets, an electronic necklaces, an electronic appcessory, an electronic tattoo, a smart mirror or a smart watch.

According to various embodiments, the electronic device may be a smart home appliance. The home appliances may include at least one of, for example, televisions (TVs), digital versatile disc (DVD) players, audios, refrigerators, air conditioners, cleaners, ovens, microwave ovens, washing machines, air cleaners, set-top boxes, home automation control panels, security control panels, TV boxes (e.g., Samsung HomeSync™, Apple TV™, or Google TV™), game consoles (e.g., Xbox™ or PlayStation™), electronic dictionaries, electronic keys, camcorders, electronic picture frames, and the like.

According to another embodiment, an electronic device may include at least one of various medical devices (e.g., various portable medical measurement devices (e.g., a blood glucose monitoring device, a heartbeat measuring device, a blood pressure measuring device, a body temperature measuring device, and the like), a magnetic resonance angiography (MRA), a magnetic resonance imaging (MRI), a computed tomography (CT), scanners, and ultrasonic devices), navigation devices, global positioning system (GPS) receiver, event data recorders (EDRs), flight data recorders (FDRs), vehicle infotainment devices, electronic equipment for vessels (e.g., navigation systems and gyrocompasses), avionics, security devices, head units for vehicles, industrial or home robots, automated teller machines (ATMs), points of sales (POSs) of stores, or internet of things (e.g., light bulbs, various sensors, electric or gas meters, sprinkler devices, fire alarms, thermostats, street lamps, toasters, exercise equipment, hot water tanks, heaters, boilers, and the like).

According to an embodiment, the electronic device may include at least one of parts of furniture or buildings/structures, electronic boards, electronic signature receiving devices, projectors, or various measuring instruments (e.g., water meters, electricity meters, gas meters, or wave meters, and the like). According to various embodiments, the electronic device may be one of the above-described devices or a combination thereof. An electronic device according to an embodiment may be a flexible electronic device. Furthermore, an electronic device according to an embodiment of the disclosure may not be limited to the above-described electronic devices and may include other electronic devices and new electronic devices according to the development of technologies.

Hereinafter, electronic devices according to various embodiments will be described with reference to the accompanying drawings. In the disclosure, the term "user" may refer to a person who uses an electronic device or may refer to a device (e.g., an artificial intelligence electronic device) that uses the electronic device.

FIG. 1 is a view schematically illustrating an external appearance of an electronic device according to an embodiment of the disclosure.

Referring to FIG. 1, an electronic device 100 according to various embodiments, for example, may include a housing 200 including a first surface 100a, a second surface 100b that is opposite to the first surface 100a, and at least one side part between the first surface 100a and the second surface 100b, and a display 160 seated on the housing 200 and at least a portion of which is exposed to be observed from the outside. At least a portion of the housing 200 may be formed of a metallic material. According to an embodiment, the entire housing 200 may be formed of a metallic material. According to an embodiment, the first surface 100a of the housing 200 may be opened and may be disposed to surround at least a portion of a periphery of the display 160. At least a portion of the side of the housing 200 may be rounded. According to an embodiment, at least one of the side surface or the rear surface of the housing 200 may be used as an antenna. In this regard, the housing 200 may include a main body 210, a first antenna area 221, or a second antenna area 222. According to an embodiment, a camera hole 240 may be disposed on one side of the housing 200, and at least a portion of a camera 180 may be exposed through the camera hole 240 to photograph a subject.

According to various embodiments, at least one physical button 230 may be disposed on one side of the housing 200. The at least one physical button 230, for example, may include a volume key 231 or an electric source key 232. According to various embodiments, the at least one physical button 230 may include a physical key, to which an application function of providing screens for execution stages is allocated, while executing user functions of the electronic device 100 in multiple stages based on specified voice instructions. According to various embodiments, the at least one physical button 230 may include a home key. According to various embodiments, the at least one physical button 230 may include a switch type physical button, and at least one of a fingerprint sensor or a pressure sensor may be disposed in the interior or an adjacent area of the at least one physical button 230. The housing 200 may include at least one hole in a specific area of a side part thereof such that the at least one physical button 230 may be disposed in the hole.

A gap (or a space or a crack) or a first insulation layer 221a may be disposed between the first antenna area 221 and the main body 210. According to various embodiments, at least one point of the first antenna area 221 may be physically or electrically connected to one side of the main body 210. In this case, the main body 210 may function as the ground to first antenna area 211. Although it is illustrated that the first antenna area 221 includes a portion of the rear surface on the upper side and a side part of the main body 210, the disclosure is not limited thereto. For example, the first antenna area 211 may include only the side part disposed on the upper side of the main body 210. Alternatively, the first antenna area 211 may include a portion of an upper side part or upper left/right side parts of the main body 210.

The second antenna area 222 may be disposed at a location (e.g., a specific lower area of the main body 210) that is opposite to an area in which the first antenna area 221 is disposed. According to an embodiment, the second antenna area 222 may include a specific portion of a rear surface on a lower side of the main body 210 and a portion of a side part on a lower side of the main body 210. A gap or a second insulation layer 222a may be disposed between the second antenna area 222 and the main body 210.

According to various embodiments, for example, at least one of a connector hole 222b, into which a universal serial bus (USB) connector or micro USB connector may be inserted, or an earphone jack hole 222c, into which an earphone jack may be inserted, may be disposed at a specific portion (e.g., a specific portion of a side part) of the second antenna area 222.

The first antenna area 221 or the second antenna area 222, which has been mentioned above, may performs a function of an antenna of at least one wireless communication module 112 (or wireless communication circuit) of the electronic device 100. For example, the first antenna area 221 or the second antenna area 222 may perform an antenna function related to a voice communication or data communication function such as 3rd generation (3G) or 4th generation (4G). Alternatively, the first antenna area 221 or the second antenna area 222 may perform an antenna function of a Wi-Fi communication circuit or an antenna function of a short range communication circuit such as Bluetooth.

At least a portion of the display 160 may be seated inside the housing through an opening corresponding to at least a portion of the first surface 100*a* of the housing 200. At least a portion of the front surface of the display 160 includes a display area, and at least a portion of a part of the display, which is seated inside the housing, may include a non-display area. An outer protective layer (e.g., glass) may be disposed on a surface of the display 160, and the display 160 may include a display panel or a panel (e.g., a touch panel or a digitizer) related to support of a touch function.

In the above-mentioned electronic device 100, the thickness of the housing 200 may be a specified thickness or less (e.g., about 2.5 mm or less). Because the thickness of the housing 200 is about 2.5 mm or less, a stop recess (e.g., a recess for stopping the housing 200 by using a specific mechanism) for electrical post-processing may be formed on at least one side of the housing 200 while at least a portion of the housing 200 or at least a portion of a structure disposed inside the housing 200 is included in the stop recess. At least a portion of the structure, for example, may be formed of a material (e.g., a nonmetallic material) that is different from that of the housing 200. A plurality of stop recesses may be formed in the housing 200.

Figure 2:
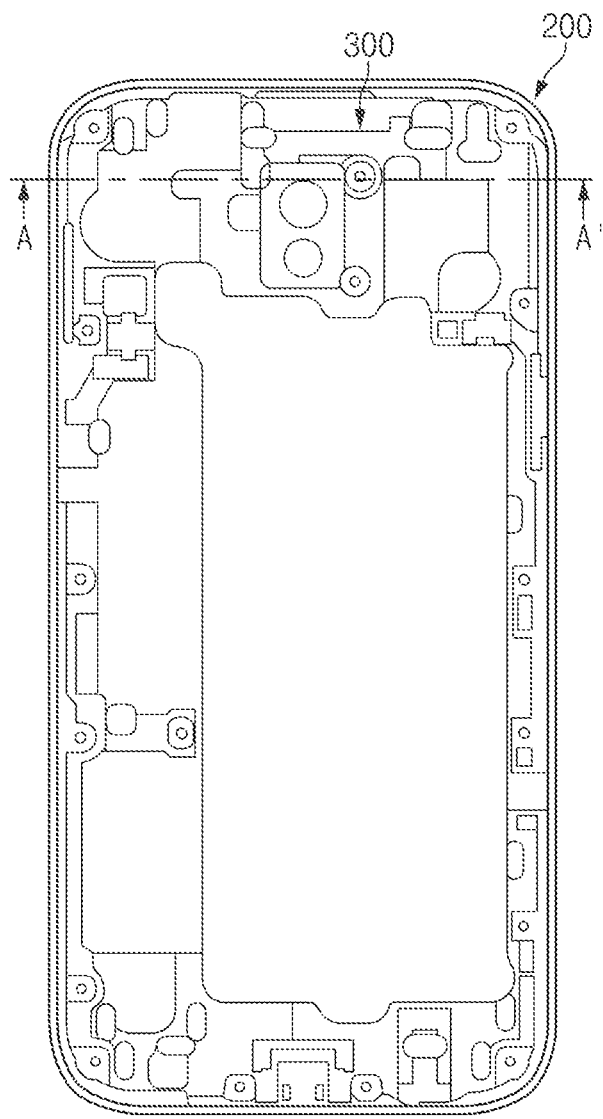
FIG. 2 is a view illustrating an example of the shape of a housing of an electronic device according to an embodiment of the disclosure.

FIG. 2 is a view illustrating an example of the shape of a housing of an electronic device according to an embodiment of the disclosure.

Referring to FIG. 2, the electronic device 100 according to an embodiment of the disclosure may include the housing 200 and a structure 300 disposed inside the housing 200. As described above, the housing 200 may include a rear surface (e.g., the second surface) and at least one side wall (e.g., the side parts) extending from a periphery of the rear surface in a specific direction (e.g., a vertical direction), and an opening surface (e.g., the first surface) may be formed at the center of the housing 200 by the side wall. At least a portion of a corner area of the housing 200, in which the side walls of the housing 200 meet each other, may be rounded. A seating space, in which at least one component related to management of the electronic device 100 may be seated, in the interior thereof may be formed in the above-mentioned housing 200 by the side walls. According to an embodiment, the structure 300 may be disposed inside the housing 200 such that components of the electronic device 100 may be seated on the structure 300. The structure 300, for example, may be formed of molded plastic. In this regard, after the housing 200 of a metallic material is formed, the structure 300 may be disposed through injection-molding or the like. The form or thickness of the structure 300 may be provided in various forms according to the shape or function of the component of the electronic device 100. According to an embodiment, the structure 300 may be disposed in a partial area of the bottom surface or a partial area of the inside of the side wall of the housing 200.

Figure 3:
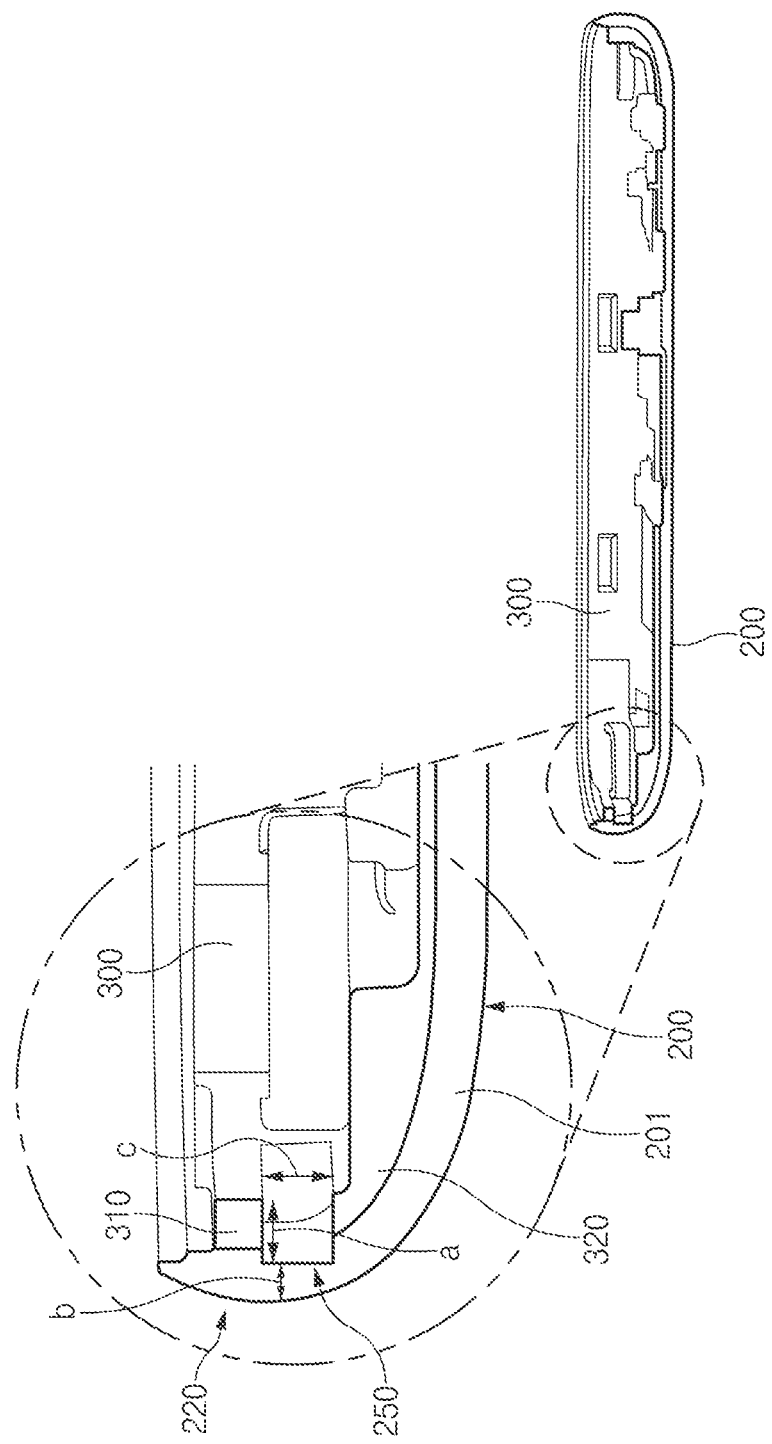
FIG. 3 is a view illustrating an example of a cutaway surface of one side of an electronic device according to an embodiment of the disclosure.
Figure 4:
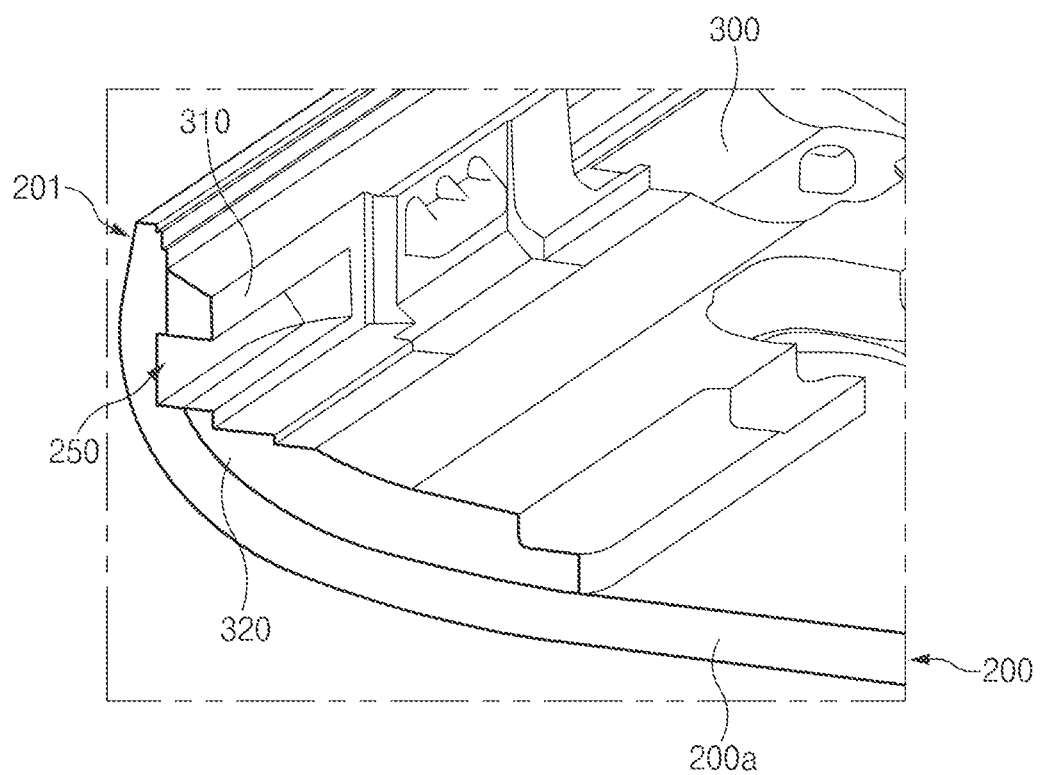
FIG. 4 is a view illustrating an example of a partial area of one side of a housing of an electronic device according to an embodiment of the disclosure in more detail.

FIG. 3 is a view illustrating an example of a cutaway surface of one side of an electronic device according to an embodiment of the disclosure. FIG. 4 is a view illustrating an example of a partial area of one side of a housing of an electronic device according to an embodiment of the disclosure in more detail.

Referring to FIGS. 3 and 4, the electronic device 100 according to an embodiment of the disclosure may include the housing 200 and the structure 300.

The housing 200 may include a bottom surface 200*a* and a first side wall 201. The bottom surface 200*a* has a specified thickness or less (e.g., about 2.5 mm or less), and has a shape in which the central portion of the bottom surface 200*a* is flat as a whole and the bottom surface 200*a* is rounded (or curved) more as it goes toward a periphery thereof. The structure 300 may be disposed in at least a portion of an inner surface of the bottom surface 200*a*. For example, a battery or a printed circuit board may be positioned on the bottom surface 200*a*. A processor 111 related to driving of the display, a wireless communication circuit (e.g., the at least one wireless communication module 112 of FIG. 1) related to a communication function of the electronic device 100 may be mounted on the printed circuit board.

The first side wall 201 may extend from a periphery of the bottom surface 200*a* by a specific height while having a specific inclination (e.g., a vertical inclination). At least a portion of the structure 300 may be positioned inside the first side wall 201. According to an embodiment, a stop recess 250 may be disposed on one side of the first side wall 201. The thickness of the first side wall 201 may be the same as, similar to, or smaller than the thickness of the bottom surface 200*a*. Alternatively, although the thicknesses of the first side wall 201 for the locations of the first side wall 201 are not constant but may be different, the first side wall 201 may be thin (e.g., about 2.5 mm or less).

The stop recess 250 may be disposed on at least one side wall of the housing 200. A portion of a side wall (e.g., the first side wall 201) of the stop recess 250 may include at least a portion (e.g., a stop part or a support) of the structure 300 disposed in an engraved side wall recess 201*a* or a periphery of the side wall recess 201*a*. Although it has been described in the above description that the stop recess 250 is disposed in the first side wall 201, the disclosure is not limited thereto. When the housing 200 has four side walls, at least one stop recess may be disposed on at least one of the four side walls. The stop recess 250 may include at least a portion of the structure 300, and accordingly, the depth of the stop recess 250 may be made deeper by a portion of the structure 300. When the stop recess 250 is disposed in at least one of the four side walls, the stop recess 250 may be disposed in at least one of the side walls of the first antenna area 221 or the second antenna area 222, which has been described above.

In relation to the stop recess 250, at least a portion of the structure 300 may include a stop part 310 or a support 320. According to various embodiments, the structure 300 may further include parts disposed in at least some of the bottom surface 200*a*, the first side wall 201, or other side walls of the housing 200. The stop part 310 may be disposed at a peripheral portion (e.g., an upper end of the side wall recess) of the side wall recess 201*a*. For example, the stop part 310 may extend from a surface of an upper end of the side recess 201*a* while having a specified inclination (e.g., an inclination that is perpendicular to the side wall) from the side wall. Because the stop part 310 protrudes from a periphery of the side wall recess 201*a*, the depth of the stop recess 250 may be made deeper. The support 320 may be disposed to be adjacent to the bottom part of the periphery of the side wall recess 201*a*. The support 320 is formed by disposing a configuration of the structure 300 at a periphery of the side wall recess 201*a*, and may have a height that is the same as or similar to the bottom surface of the side wall recess 201*a*.

As described above, for example, when the stop recess 250 is machined as illustrated in the housing that utilizes a metallic material of about 1.4 mm to 1.7 mm or injection-molding, the stop recess 250 may have a specific depth while the stop part 310 is disposed around the side wall recess 201*a*. The outer side of the housing 200 of a thickness of 0.4 mm to 0.6 mm may be additionally machined according to a design or for parts of the housing 200. In the stop recess 250, 'a' indicates a part by which a jig for current flows may be prevented during an anodizing process, and may be a depth of about 1.0 mm to 1.4 mm. Further, 'b' indicates a section in which a metal part is left after the stop recess 250 is machined, and may have a depth of about 0.5 mm to 0.97 mm. In addition, 'c' corresponds to a size that is larger than the thickness of the jig such that the anodizing jig may be inserted thereto, and may be about 1.5 mm or more. The above-mentioned sizes may be different according to the thickness and the shape of the anodizing jig.

According to various embodiments, if the stop part 310, by which the jig may be stopped, is made by using at least a portion of the structure 300 (or an injection-molding part), a metal housing may be easily manufactured by using a thin plate metal sheet that may secure a machine margin of the metal while satisfying the thickness of the metal for strength of a product. For example, at least a portion of the structure 300 that surrounds the stop recess 250 may be configured to continuously surround a circumference of the recess formed in the housing and such that the stop recess 250 becomes deeper (e.g., to have a depth that is larger than the depth of the recess formed only by the housing). Then, the sectional shape of the stop recess 250 may be polygonal (e.g., rectangular, tetragonal, or diamond-shaped) or circular or the opening corresponding to the upper end surface of the stop recess 250 may be polygonal or circular. Alternatively, at least a portion of the sectional shape of the stop recess 250 may include a curved part, and the remaining portions of the sectional shape of the stop recess 250 may have a linear form.

Figure 5:
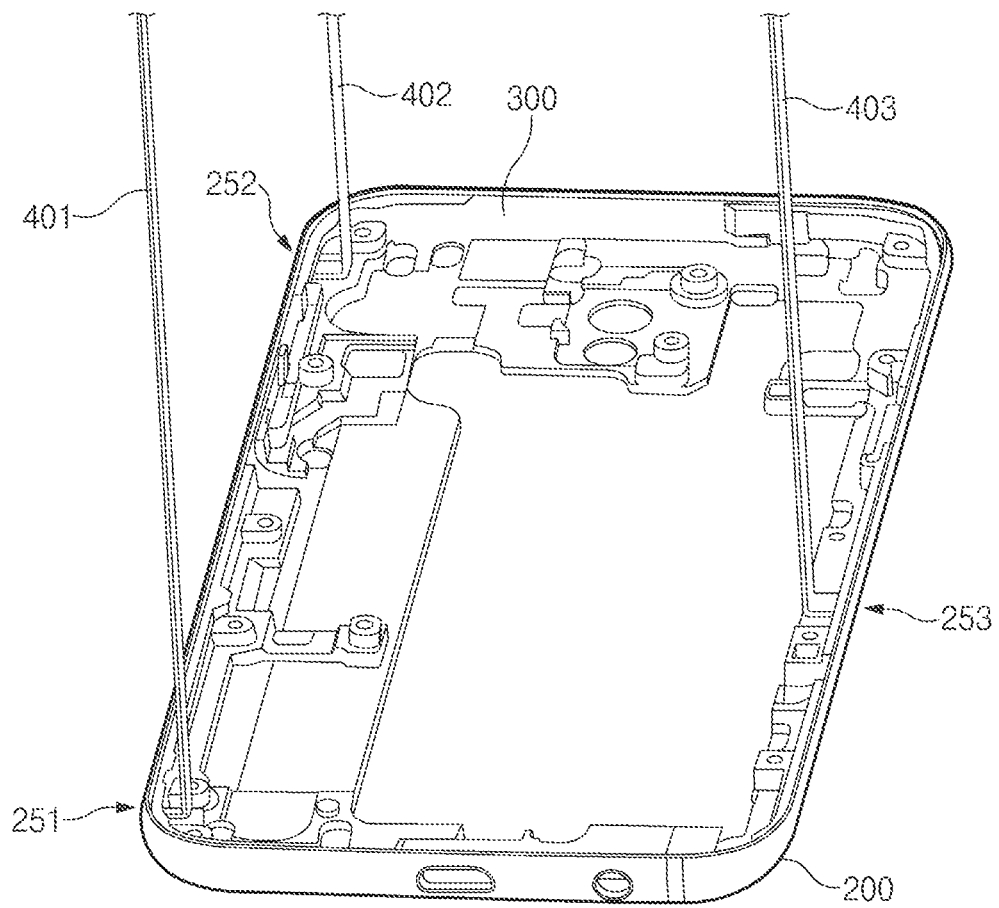
FIG. 5 is a view illustrating an example of a housing, to which a jig is coupled, according to an embodiment of the disclosure.
Figure 6:
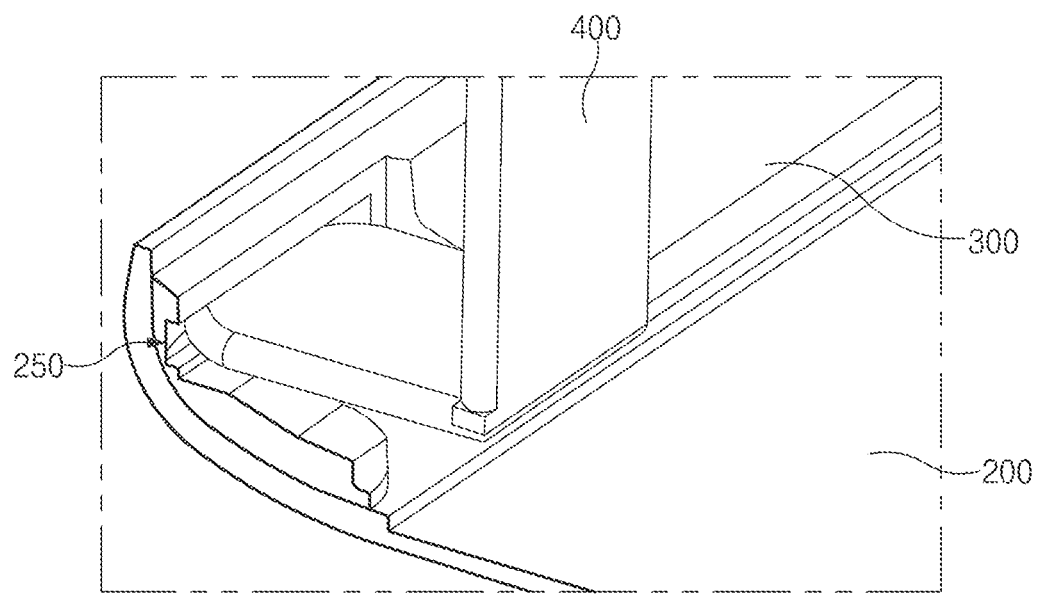
FIG. 6 is a view illustrating a portion of a housing, to which a jig is coupled, according to an embodiment of the disclosure.

FIG. 5 is a view illustrating an example of a housing, to which a jig is coupled, according to an embodiment of the disclosure. FIG. 6 is a view illustrating a portion of a housing, to which a jig is coupled, according to an embodiment of the disclosure.

For anodizing (processing of a surface of a metal), which corresponds to electrical post-processing, of the metallic material (e.g., the housing 200), a rack hanger (a jig hanger or the stop recess 250) for current flows to and from the metallic material may be disposed in the metallic material. If the rack hanger is not present or the jig is not stably held on the rack hanger, the metallic material may be lost or the surface of the metallic material cannot be properly processed during the anodizing process. When the housings for the electronic device is mass-produced, a stop part of about 1 mm or more may be necessary in order that a jig 400 for current flows to and from a metallic material may be stably coupled during an anodizing process, and when a metallic material of a thin thickness (e.g., about 2.0 mm or less) is used, the depth of the stop recess may be 1 mm or less due to securing of a thickness of an external appearance of external computerized numerical control (CNC) processing and strength. In the electronic device according to an embodiment of the disclosure, the stop recess may be made to have a specified depth (e.g., about 1 mm) by using the structure.

Referring to FIGS. 5 and 6, the housing 200 of the electronic device 100 may include stop recesses 251, 252, and 253 which the jigs 401, 402, and 403 for current flows may contact for electrical post-processing (e.g., anodizing). As described above, the bottom part and the side walls are present in the housing 200 of the electronic device 100, and the stop recesses 251, 252, and 253 may be disposed in at least one of the side walls. According to an embodiment, referring to the illustrated drawings, the stop recesses 251, 252, and 253 may include a first stop recess (e.g., stop recess 251) disposed at a lower end of the left side wall, a second stop recess (e.g., stop recess 252) disposed at an upper end of the left side wall, and a third stop recess (e.g., stop recess 253) disposed at an middle part of the right side wall. The above-mentioned structure 300 may be disposed in the interior of the housing 200.

The jigs 401, 402, and 403 may include a first jig (e.g., jig 401) stably fixed to the first stop recess 251 while electrically contacting the lower end of the left side wall of the housing 200 through the first stop recess, a second jig (e.g., jig 402) stably fixed to the second stop recess while electrically contacting the upper end of the left side wall of the housing 200 through the second stop recess, and a third jig (e.g., jig 403) stably fixed to the third stop recess 253 while electrically contacting the middle part of the right side wall of the housing 200 through the third stop recess 253. Although a structure in which three stop recesses 251, 252, and 253 or three jigs 401, 402, and 403 are disposed is illustrated in the drawings, the disclosure is not limited thereto. For example, the housing 200 may include two or not less than four stop recesses, and the jigs 401, 402, and 403 may include two or more jigs.

In the illustrated drawings, the thickness of an external machined part or the necessary size of the inner stop recess may vary according to the curvature R of the design of the external appearance of the housing 200, the size of the housing, and the complexity of the inner shape of the side part of the housing 200. When the external appearance of the housing is machined, it may be machined by 0.4 mm or more. Accordingly, the maximum thickness of the housing 200 may be 1.2 mm. When the recess for the rack hanger is machined, the side part of the housing 200 may be recessed in consideration of the thickness of about 0.5 mm to secure the strength of the housing 200 or prevent the interior of the housing 200 from being viewed from the outside.

Although it has been described in the description of FIG. 5 that the stop recesses 251, 252, and 253 are disposed in the first side wall 201 (e.g., a side part in which the first stop recess or the second stop recess is disposed) and the second side wall 202 (e.g., a side part in which the third stop recess 253 is disposed) and electric currents may flow between the jigs 401, 402, and 403 and the stop recesses 251, 252, and 253, the disclosure is not limited thereto. A stop recess may be disposed in at least one of the third side wall 203 (e.g., the upper end side wall) or the fourth side wall 204 (e.g., the lower end side wall) disposed between the first side wall 201 or the second side wall 202, and the jig may be inserted into the stop recess such that electric current may flow. Here, even though at least one stop recess is disposed in at least one of the side walls 201, 202, 203, and 204, at least two jigs may be inserted into the stop recesses.

Figure 7:
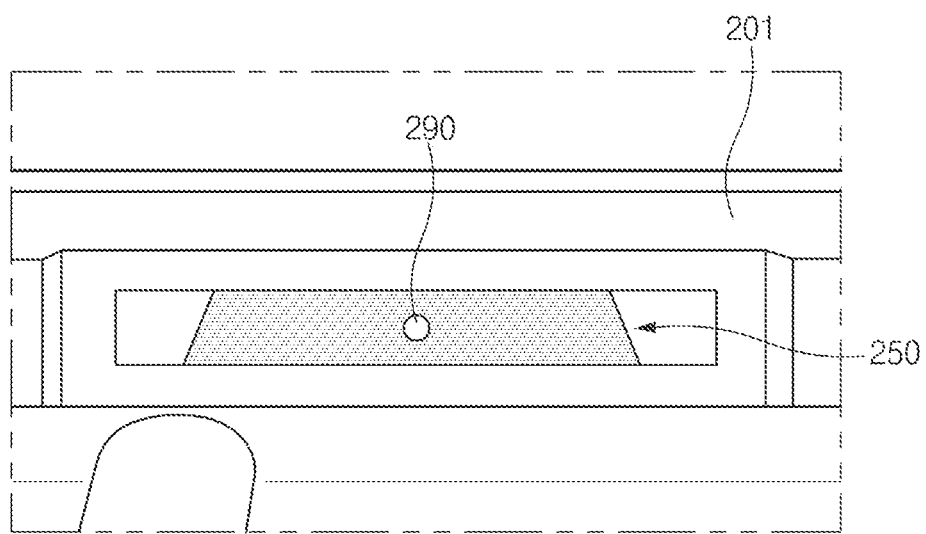
FIG. 7 is a view illustrating an example of a stop recess of a multi-bar according to an embodiment of the disclosure.

FIG. 7 is a view illustrating an example of a stop recess according to an embodiment of the disclosure.

Referring to FIG. 7, as described above, the stop recess 250 according to the disclosure, for example, may include a stop part (or a stop area) (e.g., the stop part 310 of FIG. 4) formed due to deformation of the recess formed at a portion of the first side wall 201 of the housing or the structure 300. After the jig is inserted into the stop recess 250, an inside of the first side wall 201 of the metallic housing and the jig may electrically contact each other for supply of electric power through the jig. Accordingly, as illustrated, an electrical contact point 290 may be formed inside the stop recess 250 (or the side wall recess 201a). A nonconductive layer (or an anodizing layer) may be formed through electrical post-processing in the remaining areas except to the electrical contact point 290. The nonconductive layer, for example, may include an aluminum oxide ($Al_2O_3$) layer. The anodizing layer is a layer disposed on a surface of the housing through the anodizing process, and may be formed in at least a portion of the inner and outer surfaces of the housing 200, except for an area in which the electrical contact is formed and an area in which the structure is formed. According to various embodiments, at least one stop recess, in which the electrical contact point 290 is not formed, may be formed in the housing having a plurality of stop recesses.

Figure 8:
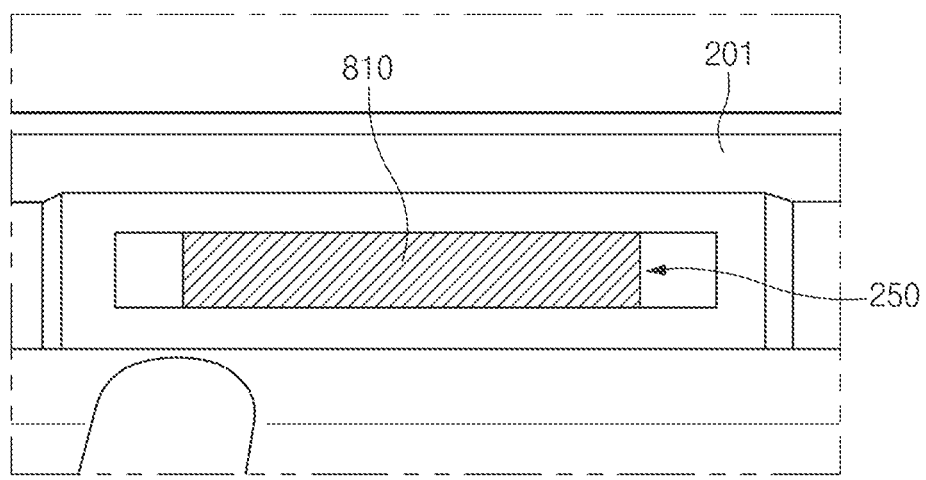
FIG. 8 is a view illustrating another example of a stop recess of a multi-bar according to an embodiment of the disclosure.

FIG. 8 is a view illustrating another example of a stop recess according to an embodiment of the disclosure.

Referring to FIG. 8, as described with reference to FIG. 7, in the first side wall 201 of the housing of the electronic device according to the disclosure, the stop recess 250 including a portion (e.g., a stop part and a support) of the structure may be disposed on one side of the first side wall 201 of the housing. For example, the stop recess 250 may include a recess provided on one side of the first side wall 201 of the housing and a stop part (e.g., the stop part 310 of FIG. 4) disposed such that a portion of the structure 300 protrudes by a specific height around the recess. According to various embodiments, a conductive member 810 may be disposed in the stop recess 250 disposed in the first side wall 201 of the housing of the electronic device. The conductive member 810 may be disposed to surround a peripheral part of the stop recess 250 while being electrically connected to the electrical contact point 290 described with reference to FIG. 7. Accordingly, the conductive member 810 may be used as an antenna connecting point when the side wall of the housing 200 is used as an antenna. According to various embodiments, the conductive member 810, for example, may be electrically connected to the communication circuit disposed in the printed circuit board of the electronic device. The conductive member 810 may function as an electrical connecting point of a ground area (e.g., when the side wall of the housing 200 functions as the ground) of the communication circuit. Alternatively, the conductive member 810 may function as a connecting point that may transmit and receive a signal of the communication circuit. According to various embodiments, the conductive member 810, for example, may include at least one of a conductive tape, a conductive clip, or a conductive spring.

Figure 9:
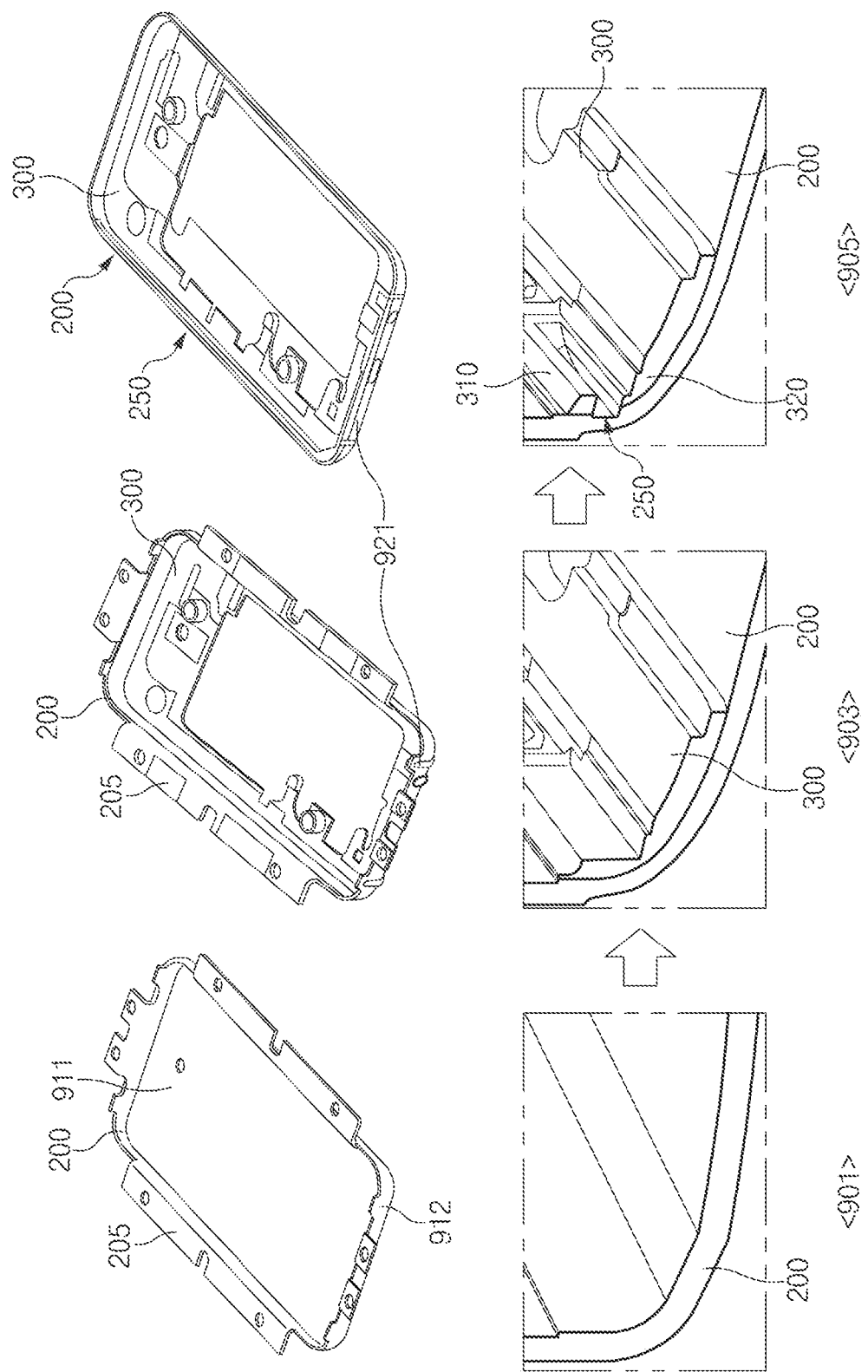
FIG. 9 is a view illustrating a process of forming a stop recess according to an embodiment of the disclosure.

FIG. 9 is a view illustrating a process of forming a stop recess according to an embodiment of the disclosure.

Referring to FIG. 9, as in state 901, the housing 200 may have a shape including a bottom part 911 and side walls 912 on one side of the housing 200 through pressing of a metallic thin plate. In this process, a wing 205 may be formed on at least one side of the housing 200. As illustrated, the housing 200 may have a thickness that is the same as or similar to the thicknesses of the bottom part 911 and the side walls 912. The side walls 912 may extend from a periphery of the bottom part 911 to have a specific height while having a specific inclination. The wings may be disposed at upper ends of the side walls 912 while having a specific angle (e.g., an angle that is perpendicular to the upper ends of the side walls 912 in a direction that becomes farther from the center of the bottom part). The wings may function to fix the housing 200 when the housing 200 is formed or the structure is formed. In state 901, the housing 200 may be formed by utilizing at least one method (pressing, casting, rolling, extrusion, and the like) of machining a metallic basic material.

As in state 903, the structure 300 may be disposed on one side of the housing 200. The structure 300 may be formed of a nonconductive material. Additionally or alternatively, an antenna articulation part 921 may be provided on one side of the housing 200. At least a portion of the structure 300 may be disposed in an aperture formed for the antenna articulation. According to an embodiment, the structure 300 may be configured by forming the nonconductive material in a specific shape, and may be configured by attaching the structure 300 to an inside of the housing 200 or bonding the structure 300 to an inside of the housing 200 while forming the nonconductive material in a specific shape. The nonconductive material (e.g., the structure 300) may be various materials, such as polycarbonate (PC) or polyphthalamide (PPA). According to various embodiments of the disclosure, the structure 300 may be bonded onto the housing 200 while the structure 300 is formed by performing chemical surface processing (e.g., technology rising from Iwate (TRI)) for reinforcing an attachment force between a metal (e.g., the housing 200) and a nonconductive material (e.g., the structure 300) and insertion-injection molding a conductive resin (e.g., a resin to which a thermoplastic resin (poly carbonate, poly butylene terephthalate (PBT), poly ethylene terephthalate (PET), poly amide (PA), PPA, poly phenylene sulfide (PPS), poly phenylene sulfone (PPSU), poly aryl etherketone (PAEK), poly ether ketone (PEEK)) and an organic material (glass fiber (GF), carbon fiber (CF), talc (stone powder, particles, and talc) are added) by using a mold.

As in state 905, the stop recess 250 may be provided in at least a portion of the inner structure while the outside of the housing 200 is machined (e.g., the wings are removed). As mentioned above, the stop recess 250 may include the stop part 310 or the support 320. The stop recess 250 may be provided on at least two of the four side walls of the housing 200.

According to various embodiments, an electronic device includes a housing including a first surface facing a first direction (e.g., a direction in which the display 160 is disposed on the bottom surface of the electronic device 100 with reference to FIG. 1), a second surface facing a second direction that is opposite to the first direction, and one or more side parts disposed in a space between the first surface and the second surface, wherein at least some of the side parts and at least a portion of the second surface of the housing are formed of a metallic material, a touchscreen display which is exposed through a portion of the first surface, an internal nonconductive structure attached along at least some of the side parts inside the housing, a wireless communication circuit disposed inside the housing, and a processor (e.g., the processor 111 of FIG. 1) electrically connected to the wireless communication circuit and the display and disposed inside the housing, the side part may include a first inner surface facing a third direction that is substantially perpendicular to the first direction, the internal nonconductive structure may include a first opening formed at a portion of the first inner surface of the side part in the third direction, the side part may include an anodizing layer formed at a portion of the first inner surface, and the anodizing layer may include a recess, through which a portion of the first inner surface is exposed.

According to various embodiments, the side parts and the second surface may be formed of the same material or may be integrally formed.

According to various embodiments, one surface of the side parts and he second surface may include an anodizing layer.

According to various embodiments, the inner structure may be attached to at least a portion of the side parts having no anodizing layer.

According to various embodiments, the metallic material may include aluminum, and the anodizing layer may include aluminum.

According to various embodiments, the recess may have at least one circular shape or polygonal shape (e.g., a tetragonal shape).

According to various embodiments, the first opening may have a polygonal shape (e.g., a tetragonal shape).

According to various embodiments, a portion of the first inner surface of the side parts may be formed to be concave in a fourth direction that is opposite to the third direction when being compared with another portion of the first inner surface with respect to a cutaway surface of the side parts.

According to various embodiments, the side parts may include a second inner surface facing a fourth direction that is opposite to the third direction, and the inner structure may include a second opening formed at a portion of the second inner surface of the side parts in the fourth direction.

According to various embodiments, the side parts may include an anodizing layer formed at a portion of the second inner surface, and the anodizing layer may include a recess, through which at least a portion of the second inner surface is not exposed.

According to various embodiments, an electronic device includes a housing including a first surface opened while facing a first direction, a second surface facing a second direction that is opposite to the first direction, and side parts disposed in different directions between the first surface and the second surface, a nonconductive structure disposed along at least a portion of the side part within the housing, and recesses including at least one recess formed on one surface of the side parts and a portion of the nonconductive structure surrounding a peripheral portion of the at least one recess.

According to various embodiments, the side parts include an anodizing layer disposed on an outer surface thereof.

According to various embodiments, the stop recess may include an anodizing layer formed on an inner surface of the at least one recess, and an electrical contact point disposed on one side of the at least one recess.

According to various embodiments, the electronic device may further include a conductive member electrically connected to the electrical contact point while covering an opening area of the stop recess.

According to various embodiments, the electronic device may further include a printed circuit board disposed inside the housing and on which a communication circuit electrically connected to the conductive member is mounted.

According to various embodiments, the side walls may include a first side wall extending from a first periphery of the second surface while having a specific inclination from the first periphery, a second side wall disposed to face the first side wall at a second periphery that is opposite to the first periphery, a third side wall disposed at a third periphery disposed between one end of the first periphery and one end of the second periphery and between the first side wall and the second side wall, and a fourth side wall disposed at a fourth periphery disposed between an opposite end of the first periphery and an opposite end of the second periphery and between the first side wall and the second side wall.

According to various embodiments, at least some of the stop recesses may be disposed in the first side wall and the remaining ones of the stop recesses are disposed in the second side wall.

According to various embodiments, the electronic device may further include at least one of a first antenna articulation part formed to include at least a portion of the third side wall, and a second antenna articulation part formed to include at least a portion of the fourth side wall.

According to various embodiments, the stop recess may be formed in at least one of the first antenna articulation part and the second antenna articulation part.

According to various embodiments, a portion of the nonconductive structure disposed around the stop recess may be configured such that the depth of the recess is larger than the depth of a part formed only by the housing (e.g., the depth of the recess formed by a portion of the nonconductive structure is added to the depth of the recess) while continuously surrounding a periphery of the at least one recess, or may be configured such that protrusions having a specific thickness and a specific width are provided at a specific interval while surrounding a periphery of the at least one recess.

Figure 10:
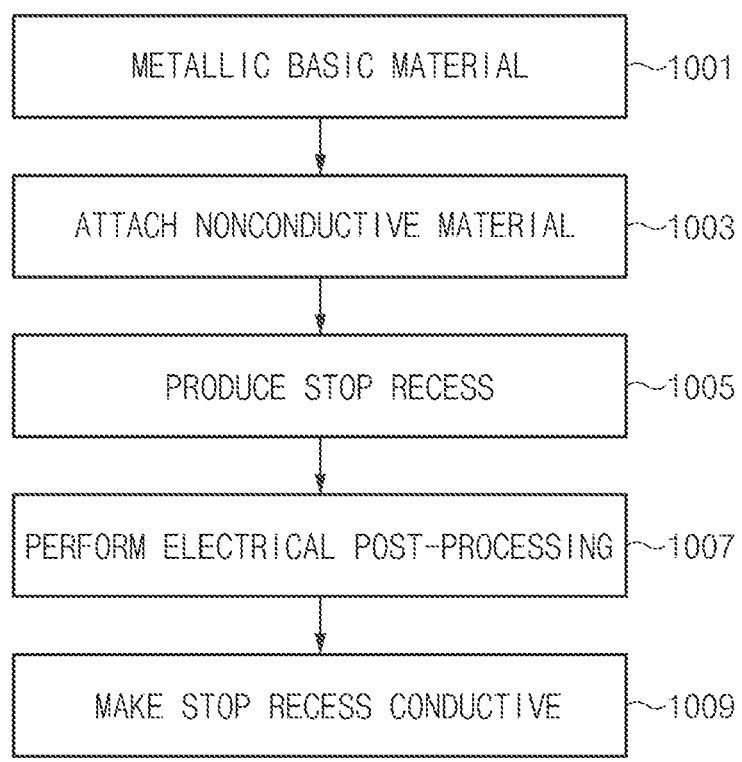
FIG. 10 is a view illustrating an example of a method of manufacturing a housing of an electronic device according to an embodiment of the disclosure.

FIG. 10 is a view illustrating an example of a method of manufacturing a housing of an electronic device according to an embodiment of the disclosure.

Referring to FIG. 10, in the method for manufacturing a housing according to the disclosure, for example, in operation 1001, a metallic basic material may be provided. The metallic basic material, for example, is a conductive material (e.g., aluminum or an aluminum alloy), has a thickness or less (e.g., about 2.5 mm or less), and has a panel shape of a size that is larger than the size of the housing 200. If the metallic basic material is provided, the housing 200 in which the wings having the above-described form are disposed may be provided in state 901 of FIG. 9 through machining (e.g., pressing).

In operation 1003, a nonconductive material attaching process may be performed. In this regard, the structure 300 may be fixed through a bonding operation while the structure 300 obtained by machining the nonconductive material in a specific form is seated inside the housing 200. Alternatively, the structure 300 may be fixed to an inside of the housing 200 when the structure 300 is formed while a resin of a specific material is insert injection-molded inside the housing 200.

In operation 1005, a stop recess (or rack hanger) producing process may be performed. At least one stop recess may be formed at a portion of the areas in which the structure 300 is formed, by which the jig is stopped. In this regard, the stop recess 250 may be provided by performing a process (e.g., CNC machining) of cutting away a portion of the structure 300 and a portion (e.g., a portion of a side wall) of the housing 200 at a location at which the stop recess 250 is to be formed.

In operation 1007, an electrical post-processing process may be performed. In this regard, the jig, through which electric currents may flow, may electrically contact the housing 200 while being inserted into the stop recess 250. In a process of inserting the jig into the stop recess 250, the jig may be electrically connected to the bottom part (e.g., the side wall surface of the housing 200) of the stop recess 250. While an electric voltage of a specific value is supplied to the jig, a nonconductive layer (e.g., an anodizing layer) may be formed on a surface of the housing 200 while the housing 200 is immersed in a solution for electrical post-processing. In this operation, because the jig is maintained in a state in which the jig contacts the inner surface of the stop recess 250, an electrical contact point 290 may be formed in at least one point of the inner surface of the stop recess 250.

In operation 1009, a conduction process for the stop recess may be performed. As described with reference to FIG. 8, at least portion of the side wall having the stop recess 250 may support electrical characteristics of the printed circuit board while the conductive member is disposed inside the stop recess 250. For example, the side wall may perform a communication function or function as the ground through the stop recess 250. Operation 1009 may be optionally performed. For example, operation 1009 may be omitted according to the change of the process.

Figure 11:
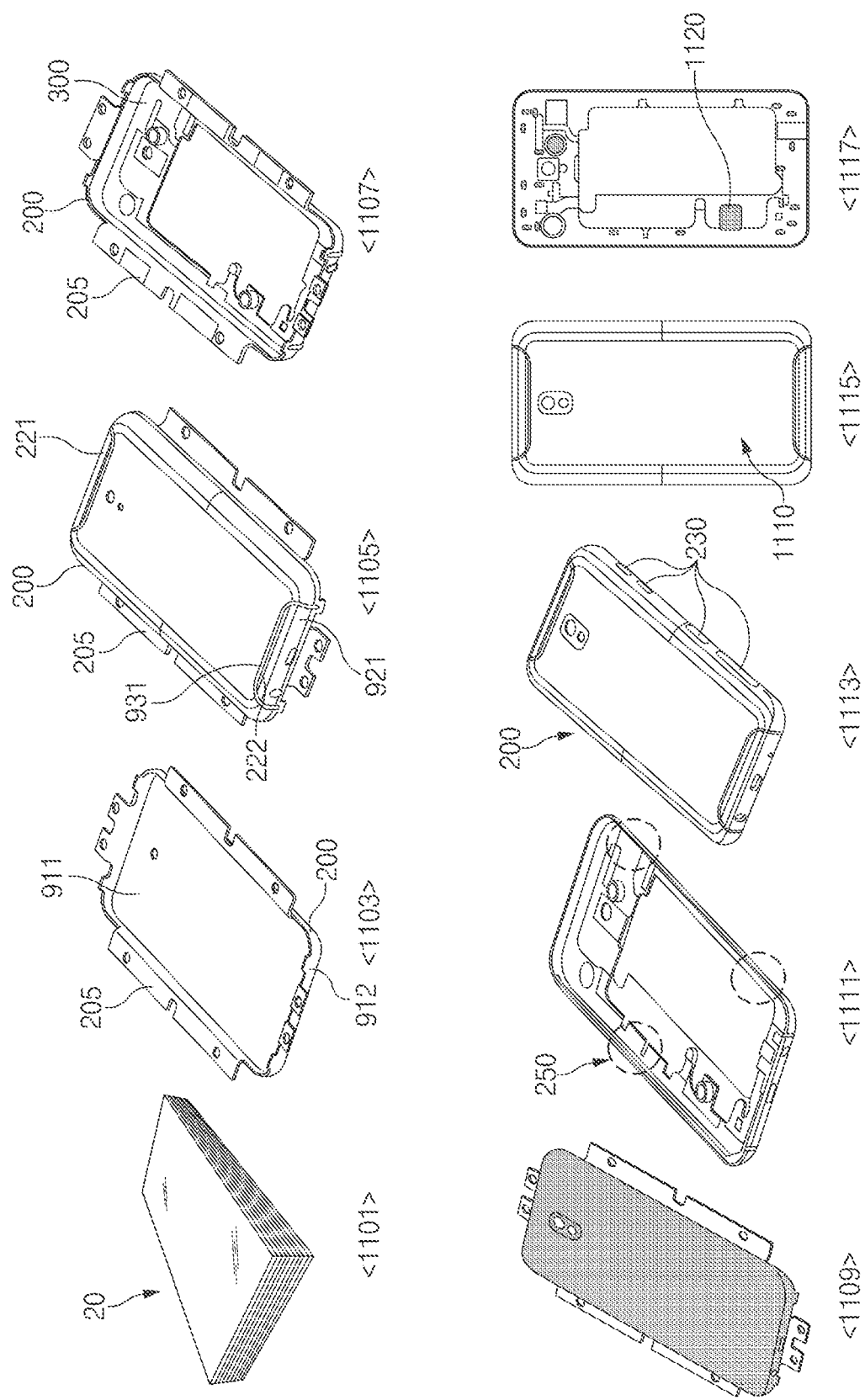
FIG. 11 is a view illustrating an example of a housing process of an electronic device according to an embodiment of the disclosure.

FIG. 11 is a view illustrating an example of a housing process of an electronic device according to an embodiment of the disclosure.

Referring to FIG. 11, as in state 1101, a metallic basic material 20 of a thin plate may be provided. The thin plate (or thin shape) may have a specific thickness or less (e.g., about 2.5 mm or less). The metallic basic material 20, for example, may include a thin panel of aluminum or an aluminum alloy.

As in state 1103, the metallic basic material 20 of a thin plate may be pressed. In the pressing process, the metallic basic material 20 of the thin plate may be formed to include the housing 200 including the bottom part 911 and the side walls 912 extending from a periphery of the bottom part 911 upwards by a specific height and wings extending from at least some of the side walls 912. The wings may perform a function of fixing the housing 200 during various additional processes for the housing, and may be removed after a specific process.

As in state 1105, CNC machining may be performed before insert injection-molding. The CNC machining, for example, may include machining of a metal entangled structure of an inner side of the housing 200 (machining for a structure in which, after at least one machined end, a convexo-concave portion, or a machined hole is formed one at least one side of a metallic component such that a resin may be physically tightly stopped by a metallic component (e.g., the housing) when an inside of the housing is insert injection-molded, the resin is inserted into and fixed to the machined end, the convexo-concave portion or the machined hole), machining of an injection-molding mold combined surface of the inner side of the housing 200 (a structure assembled in the mold is formed on one side of the housing or in at least some wings such that size precision may be increased in relation to alignment of the housing when the housing is seated on the injection-molding mold), machining of the shape of an articulation part of an outer antenna, and machining of an outer USB or an ear jack hole. When the shape of the antenna articulation part 921 is machined, at least one bridge 931 (e.g., a part that physically connects the main body of the housing 200 and the antenna articulation part 921) may be provided.

As in state 1107, TRI processing and insert injection-molding may be performed. In this operation, TRI processing may be performed on a surface of the housing 200 for improvement of a resin bonding force of a metal surface of the housing 200 and the structure 300. After the TRI processing, the inner structure is injection-molded and the outer antenna articulation part may be injection-molded. The injection molding process for the inner structure may be replaced by a process of attaching the structure 300 to a surface of the housing 200 based on a bonding agent after the structure 300 is separately provided.

As in state 1109, design shape machining may be performed before the insert injection-molding. In the design shape machining process, the shape for the rear surface of the housing 200 and the upper, lower, left, and right designs may be machined. For example, in the design forming process, a process of engraving a logo or the like or removing injection-molded products protruding to the outside of the antenna articulation part may be performed.

As in state 1111, a CNC process may be performed after the insert injection-molding. In this process, the wings may be removed and a stop recess (or a rack hanger) for anodizing may be formed (e.g., a T-cut may be machined). Additionally, an area for a battery seating part may be machined inside the housing 200. In relation to machining of the area for the battery seating part, a specific area of an inner side of the housing 200 corresponding to the size of a battery may be engraved further than a peripheral part of the housing 200 through the CNC process.

As in state 1113, a side part of the housing 200 may be machined. For example, at least one button hole may be disposed in a side part of the housing 200. The at least one button hole, for example, may include at least one of a volume key hole, a specified function key hole (e.g., a hole in which a button configured to perform a user function of the electronic device based in a voice), a power source key hole, or a hole key hole.

As in state 1115, at least a partial area including a rear surface 1110 of the housing may be surface-processed and anodized. After the above-described jig for current flows is seated in the stop recess (the stop recess 250 of FIG. 2 and the like), an anodizing process may be performed in a specified environment. Additionally, before the performance of the anodizing process for the housing 200, polishing and sanding processes for at least a partial surface (e.g., at least a partial area of the rear surface 1110) of the housing may 200 be performed. During the anodizing process, the housing 200 may have a specific color.

As in state 1117, an antenna contact part 1120 may be machined. The antenna contact part 1120 that may be electrically connected to the housing 200 may be machined in at least one of the inner side or the side walls of the housing 200. The antenna contact part 1120 may be electrically connected to the communication module disposed in the printed circuit board (not illustrated) through the above-described conductive member. According to various embodiments, the antenna contact part 1120 may be disposed in at least one of the stop recesses. For example, at least one stop recess may be formed in at least one of the antenna articulation parts, and the antenna contact part that may be electrically connected to the communication circuit mounted on the printed circuit board through the electrical contact point provided in the stop recesses may be disposed. Then, the antenna contact part may include the above-described conductive member (e.g., a conductive member of a clip form or a conductive tape).

According to various embodiments, some of the sequences of the above-described process may be changed. For example, the process may be changed such that state 1117 may be prior to state 1113. Alternatively, the process may be changed such that state 1113 may be prior to state 1111. In this way, the sequences of the plurality of states of the process may be changed according to a change of the process of manufacturing the housing of the electronic device or if necessary.

Figure 12:
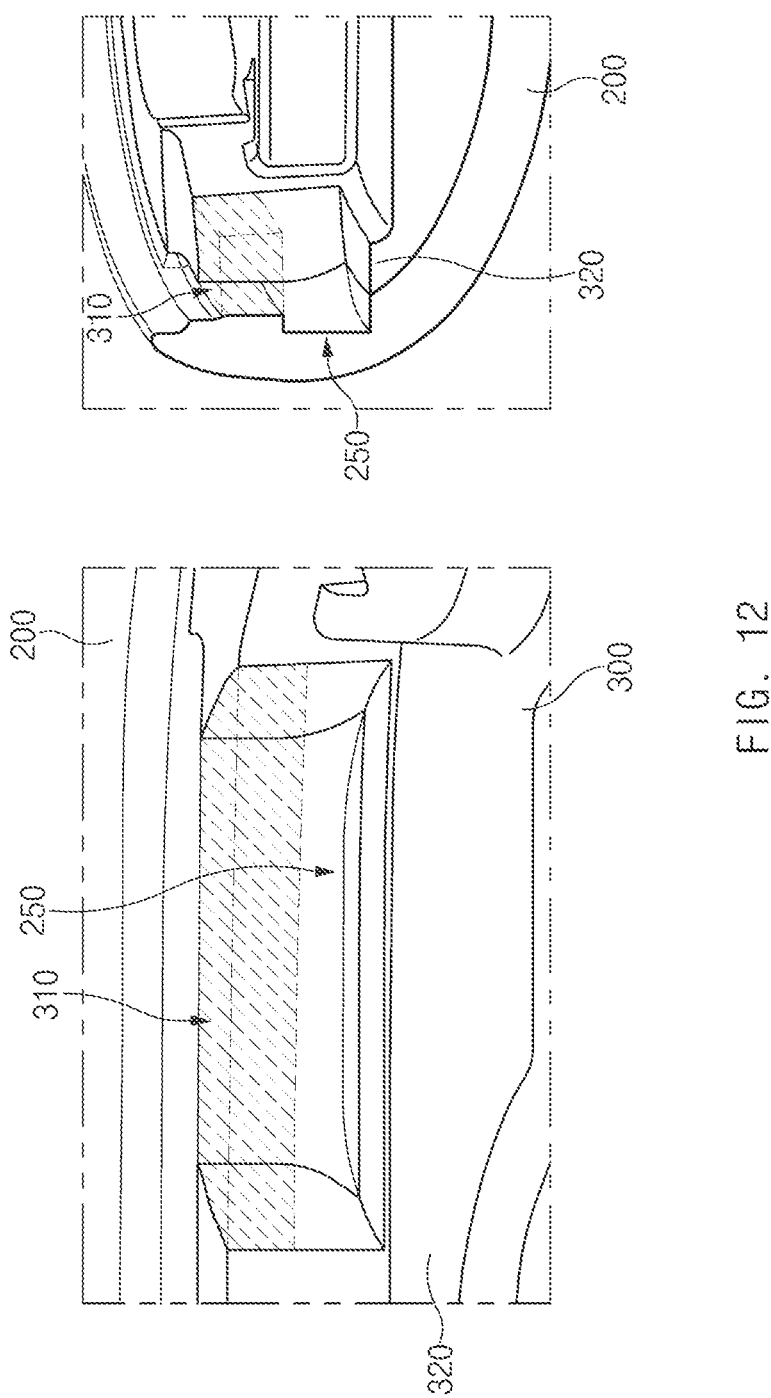
FIG. 12 is a view illustrating an example of another form of a stop recess according to an embodiment of the disclosure.

FIG. 12 is a view illustrating an example of another form of a stop recess according to an embodiment of the disclosure.

Referring to FIG. 12, the stop recess 250 according to an embodiment of the disclosure may be provided while a portion of the structure 300 is removed. For example, stop recesses may be provided such that the support 320 is maintained and at least one of the stop parts are removed. As the stop part 310 is removed, an upper end of the stop recess 250 may be opened upwards. The process, for example, may be performed after the anodizing process is completed. After the anodizing process is completed, at least a portion of the side wall, which is covered by the stop part 310 may be exposed as the stop part 310 is removed. The exposed portion of the side wall may be electrically exposed. The exposed portion of the side wall, for example, may be electrically connected to the communication module of the printed circuit board or the like through the conductive member or the like. According to various embodiments, as illustrated, at least a portion of the structure 300, which surrounds the stop recess 250, may be provided to discontinuously surround the recess by removing at least a portion of the stop part 310. Although the shape, in which at least a portion of the stop part 310 is removed, has been described with reference to the illustrated drawing, the stop recess 250 may have a shape, in which at least a portion of the support 320 is removed.

Figure 13:
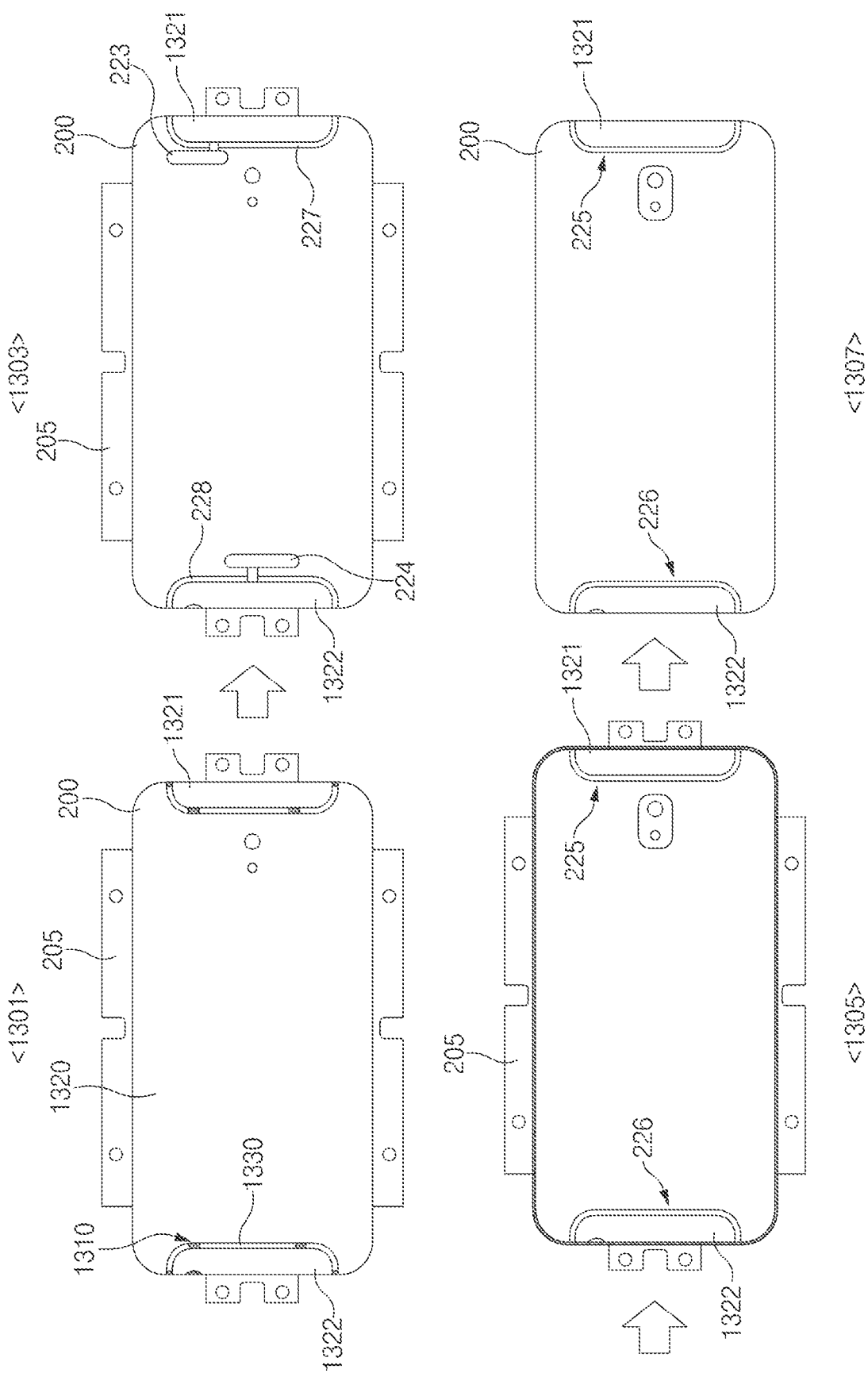
FIG. 13 is a view illustrating an example of forming an antenna articulation part of a housing according to an embodiment of the disclosure.
Figure 14:
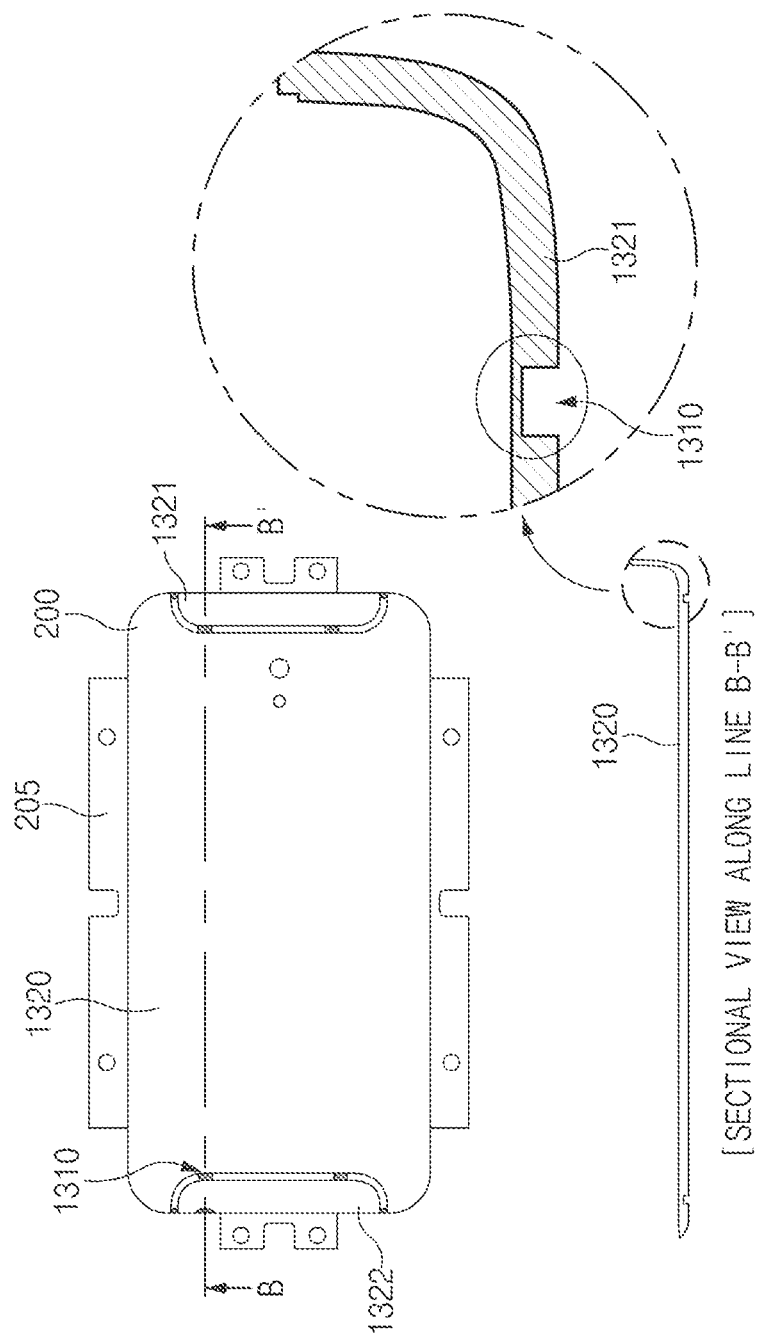
FIG. 14 is a view illustrating an example of an antenna articulation part of a housing according to an embodiment of the disclosure.
Figure 15:
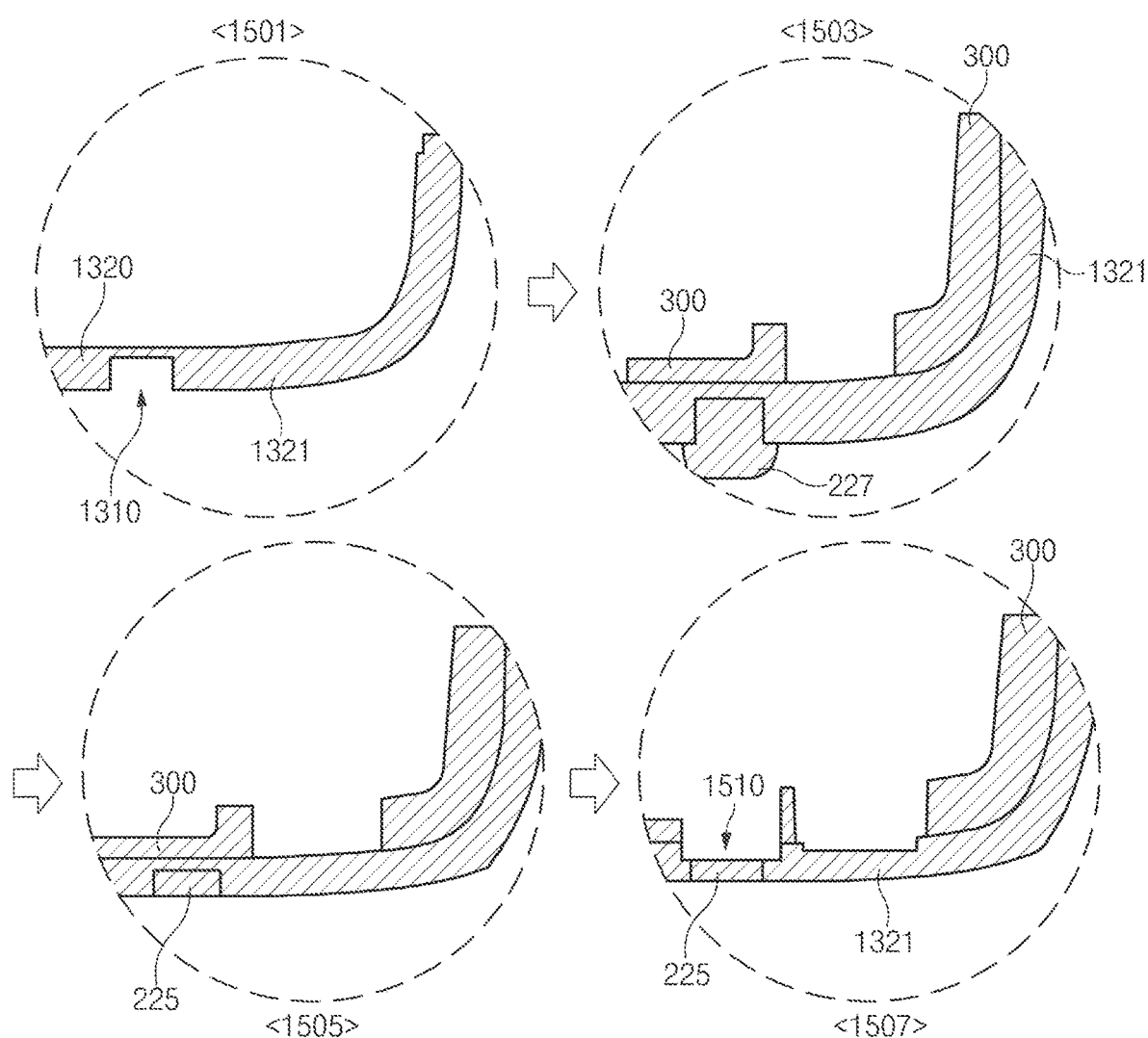
FIG. 15 is a view illustrating an example of a section of an antenna articulation part of a housing according to an embodiment of the disclosure.

FIG. 13 is a view illustrating an example of forming an antenna articulation part of a housing according to an embodiment of the disclosure. FIG. 14 is a view illustrating an example of an antenna articulation part of a housing according to an embodiment of the disclosure. FIG. 15 is a view illustrating an example of a section of an antenna articulation part of a housing according to an embodiment of the disclosure.

Referring to FIG. 13, as in state 1301, the housing 200 temporarily fixed based on the wing 205 may include antenna articulation parts formed through CNC machining. The antenna articulation parts, for example, may include a first antenna articulation part 1321 (e.g., the first antenna area 221) and a second antenna articulation part 1322 (e.g., the second antenna area 222). Accordingly, the housing 200 may have a gap 1330 between the main body 210 and the antenna articulation parts 1321 and 1322. The housing 200 may include at least one bridge 1310 connecting the antenna articulation parts 1321 and 1322 and a main body 1320. The at least one bridge 1310, for example, include at least one bridge fixing the first antenna articulation part 1321 to the main body 1320 and at least one bridge fixing the second antenna articulation part 1322 to the main body 1320. Although it is illustrated in the drawing that two bridges are disposed between the first antenna articulation part 1312 (or the second antenna articulation part 1322) and the main body 1320, the disclosure is not limited thereto. For example, the at least one bridge 1310 or three or more bridges may be disposed between the first antenna articulation part 1321 and the main body 1320.

As in state 1303, a resin may be filled in the gap 1330 between the first antenna articulation part 1321 and the second antenna articulation part 1322 through insert injection-molding after the first antenna articulation part 1321 and the second antenna articulation part 1322 are produced, while the at least one bridge 1310 is maintained. While the resin is filled in the gap 1330, a portion 227 and a portion 228 (e.g., a runner) of the structure may protrude from a surface of the rear surface of the housing 200 as illustrated. A portion 223 and a portion 224 of the structure corresponding to an injection-molding gate may be formed on a surface of the housing 200.

As in state 1305, at least some of the portions 223, 224, 227, and 228 of the protruding structure may be removed in the process of producing the stop recess of the housing 200. Alternatively, at least some of the portions 223, 224, 227, and 228 of the structure may be removed in the process of machining the side part of the housing 200. According to an embodiment, a part of the portion 223 and the portion 224 of the structure, which protrudes from a surface of the housing 200, is removed, and connecting parts 225 and 226 that bury gaps between the main body 1320 and the antenna articulation parts 1321 and 1322 may be formed.

As in state 1307, the housing 200 may have a specific color through the anodizing process after the wings are removed from the housing 200 and a surface of the housing 200 is processed. In this process, at least a portion of the at least one bridge 1310 may be removed.

Referring to FIG. 14, after the metallic basic material is pressed, the gap 1330 may be formed between the main body 1320 and the antenna articulation parts 1321 and 1322 through CNC machining. As described above, according to an embodiment, the housing 200 may include the at least one bridge 1310 of a specific width and a specific thickness, which connects the main body 1320 and the antenna articulation parts 1321 and 1322. The at least one bridge 1310 may have a thickness that is smaller than the thickness of the peripheral part. In this regard, a space between the main body 1320 and the antenna articulation parts 1321 and 1322 are passed through to form the gap 1330 in the CNC machining process, and in the area of the at least one bridge 1310, a partial area of the main body 1320 and the antenna articulation parts 1321 and 1322 may be recessed such that the at least one bridge 1310 of a specific thickness may be formed.

Referring to FIG. 15, in state 1501, the housing 200 may include the first antenna articulation part 1312 (or the second antenna articulation part, hereinafter, the first antenna articulation part 1321 will be described) through machining of one side (e.g., the bottom part) of the housing 200. The at least one bridge 1310 connecting the main body 1320 and the first antenna articulation part 1321 may be disposed on one side of the housing 200. The thickness of the at least one bridge 1310 may be similar to or thinner than the thickness of the peripheral part (e.g., the thickness of the first antenna articulation part 1321 or the thickness of the main body 1320).

As in state 1503, the structure 300 may be disposed inside the housing 200 through insert injection-molding. Additionally, as the gap 1330 between the main body 1320 and the first antenna articulation part 1321 is filled with a resin in the insert injection-molding process, the portion 227 of the structure may protrude from a surface of the rear surface of the housing 200. As at least some parts of portion 227 of the structure are disposed in the interior of the gap 1330 and on the at least one bridge 1310, they may protrude from the surface of the rear surface of the housing 200 by a specific height.

As in state 1505, in the process of machining the rear surface of the housing 200, the protruding parts of the portion 223 of the structure, which protrudes from the rear surface of the housing 200, may be removed. Accordingly, a connecting part 225 that buries the gap 1330 between the main body 1320 and the first antenna articulation part 1321 and the upper side of the at least one bridge 1310 may be formed. A surface of the connecting part 225 may be disposed in parallel to the surface of the rear surface of the housing 200. Alternatively, a surface of the connecting part 225 may be disposed to be continuous with the surface of the rear surface of the housing 200.

As in state 1507, at least a portion of the structure 300 disposed inside the housing 200 (e.g., on the inner surface of the bottom part) may be removed. According to an embodiment, a process of removing a portion of the structure disposed in an area of the at least one bridge 1310 of the structure 300 and at least a portion of the bottom part of the housing 200 may be performed. Through the process, an area 1510, in which a portion of the structure and the at least one bridge 1310 are removed, is provided, and the connecting part 225 in state 1505 may have the same thickness as in state 1507 or may have a thickness that is thinner than before as a portion of the connecting part 225 is removed when the at least one bridge 1310 is removed.

According to various embodiments, only some of the at least one bridge 1310 disposed between the main body 1320 and the antenna articulation parts 1321 and 1322 may be removed. For example, when two bridges are disposed between the main body 1320 and the antenna articulation parts 1321 and 1322, some bridges may be removed and some bridges may be maintained in the process of removing the bridges. The main body may be used as a ground area for the antenna articulation part while the antenna articulation part is electrically connected to the main body through the bridge. For example, the first antenna articulation part 1321 may be physically or electrically connected to the main body 1320 through one bridge. All the bridges disposed between the second antenna articulation part 1322 and the main body 1320 may be removed.

Figure 16:
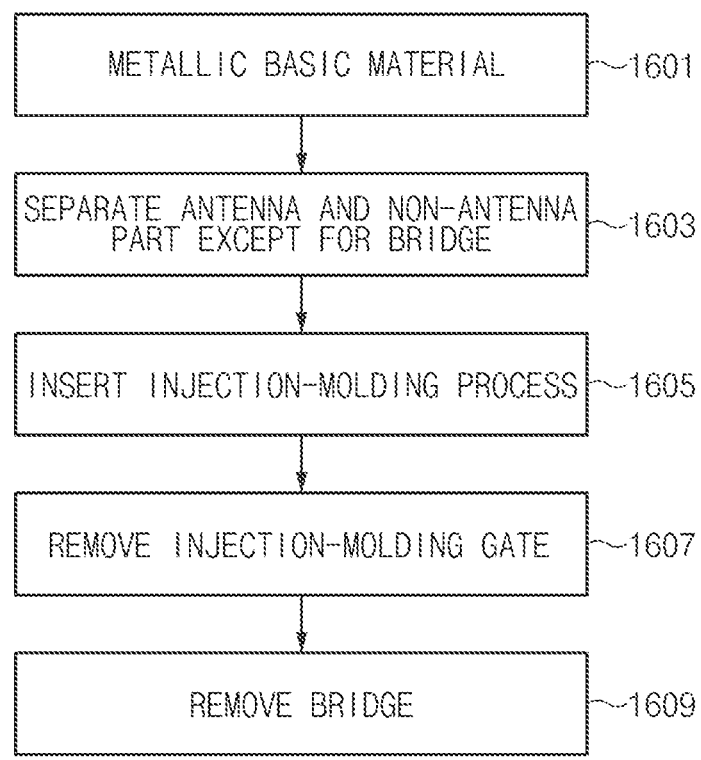
FIG. 16 is a view illustrating an example of a method of forming an antenna articulation part of a housing according to an embodiment of the disclosure.

FIG. 16 is a view illustrating an example of a method of forming an antenna articulation part of a housing according to an embodiment of the disclosure.

Referring to FIG. 16, in the method for forming an antenna articulation part according to an embodiment of the disclosure, a metallic basic material may be provided, in operation 1601. The metallic basic material, for example, may have the size corresponding to the size of the housing of the electronic device and the size of the wings for fixing the housing.

In operation 1603, the antenna except for the at least one bridge 1310 and the non-antenna part may be separated. For example, as described above with reference to FIGS. 13 to 15, gaps may be formed between the antenna articulation parts 1321 and 1322 and the main body 1320.

In operation 1605, an insertion injection-molding process may be performed. Through this process, the gap 1330 may be filled with a resin. Additionally, the at least one bridge 1310 may have a thickness that is thinner than a peripheral part of the rear surface of the housing 200, and accordingly, the resin may be disposed on the at least one bridge 1310. According to an embodiment, in the insert injection-molding process, the resin may protrude from the surface of the rear surface of the housing 200 by a specific height while being positioned on the gap 1330 and the at least one bridge 1310.

In operation 1607, an injection-molding gate may be removed. As described in operation 1605, in order to fill the resin between the gap 1330 and the at least one bridge 1310, the injection-molding gate is provided while the insert injection-molding process is performed, and in this process, the injection-molding gate may be removed. Additionally, a portion of the structure protruding from the rear surface of the housing 200 may be removed. According to various embodiments, the sequences of the process of removing the injection-molding gate or a runner (e.g., a portion of connecting parts 225 and 226 of the structure) and a process of removing the at least one bridge 1310, which will be described below, may be changed.

In operation 1609, the at least one bridge 1310 may be removed. A CNC machining process may be performed on the area in which the at least one bridge 1310 is disposed so that a portion of the structure and the at least one bridge 1310 may be removed. Through the process of removing the at least one bridge 1310, the area in which the at least one bridge 1310 had been disposed may be thinner than the bottom part of the housing 200. The at least one bridge 1310 may function to firmly fix the antenna articulation part to one side of the main body 1320 so that the antenna articulation part and the main body are not separated from each other when the structure 300 is formed.

Although it has been described in the above description that the at least one bridge 1310 is formed by leaving a portion of the housing 200, the disclosure is not limited thereto. For example, a separate structure (or a separate piece) that functions as a bridge may be disposed between the antenna articulation parts 1321 and 1322 and the main body 1320.

Further, the embodiments disclosed in the specification are provided to describe the technical contents or for understanding of the technical contents, and the technical scope of the disclosure is not limited thereto. Accordingly, the scope of the disclosure should be construed to include all changes or various embodiments based on the technical spirit of the disclosure.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A portable communication device comprising:
   a housing comprising a conductive sidewall having an outer surface and an inner surface, the inner surface of the conductive sidewall including a recess formed therein; and
   a non-conductive member comprising an opening formed therein, the non-conductive member disposed on the inner surface of the conductive sidewall such that a first periphery of the opening is substantially aligned with a first periphery of the recess, and that a second periphery of the opening facing the first periphery of the opening is substantially aligned with a second periphery of the recess facing the first periphery of the recess,
   wherein the inner surface of the conductive sidewall in which the recess is formed, comprises an anodized area and a non-anodized area substantially surrounded by the anodized area.

2. The portable communication device of claim 1, wherein a thickness between the outer surface and the inner surface of the conductive sidewall in an area in which the recess is not formed, is between 1.4 mm and 1.7 mm.

3. The portable communication device of claim 1, wherein a thickness between the outer surface and the inner surface of the conductive sidewall in an area in which the recess is formed, is between 0.5 mm and 0.97 mm.

4. The portable communication device of claim 1, wherein a depth of the recess is between 1.0 mm and 1.4 mm.

5. The portable communication device of claim 1, wherein a width of the opening is greater than 1.5 mm.

6. The portable communication device of claim 1,
   wherein the housing comprises another conductive sidewall facing the conductive sidewall, and
   wherein the other conductive sidewall includes another recess formed in an inner surface thereof and substantially facing the recess formed in the inner surface of the conductive sidewall.

7. The portable communication device of claim 1, wherein the non-conductive member is not formed in the recess.

8. A portable communication device comprising:
   a housing including at least a first sidewall and a second sidewall, wherein the first sidewall comprises a first conductive member and a first non-conductive member, wherein the first conductive member comprises a first recess formed therein, wherein the first non-conductive member comprises a first opening formed therein, the first non-conductive member disposed on an inner surface of the first conductive member, wherein at least portion of the first opening is substantially aligned with the first recess, and wherein the first recess of the first conductive member comprises an anodized area and a non-anodized area substantially surrounded by the anodized area.

9. The portable communication device of claim 8, wherein the second sidewall comprises a second conductive member and a second non-conductive member, and wherein the second conductive member comprises a second recess formed in an inner surface thereof and the second non-conductive member comprises a second opening formed therein, at least a portion of the second recess being substantially aligned with the second opening.

10. The portable communication device of claim 9, wherein the first and second recesses are formed such that a jig, related to an anodizing process, hangs the housing by the first and second recesses during the anodizing process.

11. The portable communication device of claim 8, wherein the first non-conductive member is not formed in the first recess.

12. The portable communication device of claim 8, wherein a thickness between an outer surface and the inner surface of the first conductive member in an area in which the first recess is not formed, is between 1.4 mm and 1.7 mm.

13. The portable communication device of claim 8, wherein a thickness between an outer surface and the inner surface of the first conductive member in an area in which the first recess is formed, is between 0.5 mm and 0.97 mm.

14. The portable communication device of claim 8, wherein a depth of the first recess is between 1.0 mm and 1.4 mm.

15. The portable communication device of claim 8, wherein a width of the first opening is greater than 1.5 mm.

16. The portable communication device of claim 8, wherein the first recess is formed such that a jig, related to an anodizing process, hangs the housing by the first recess during the anodizing process.

* * * * *